US009478685B2

(12) United States Patent
Yu et al.

(10) Patent No.: US 9,478,685 B2
(45) Date of Patent: Oct. 25, 2016

(54) VERTICAL PILLAR STRUCTURED INFRARED DETECTOR AND FABRICATION METHOD FOR THE SAME

(71) Applicant: ZENA TECHNOLOGIES, INC., Cambridge, MA (US)

(72) Inventors: Young-June Yu, Cranbury, NJ (US); Munib Wober, Topsfield, MA (US)

(73) Assignee: ZENA TECHNOLOGIES, INC., Cambridge, MA (US)

( * ) Notice: Subject to any disclaimer, the term of this patent is extended or adjusted under 35 U.S.C. 154(b) by 0 days.

(21) Appl. No.: 14/311,954

(22) Filed: Jun. 23, 2014

(65) Prior Publication Data
US 2015/0372175 A1  Dec. 24, 2015

(51) Int. Cl.
| | | |
|---|---|---|
| *G01J 5/20* | (2006.01) | |
| *H01L 31/0352* | (2006.01) | |
| *H01L 31/108* | (2006.01) | |
| *H01L 31/113* | (2006.01) | |
| *H01L 31/0216* | (2014.01) | |
| *H01L 31/18* | (2006.01) | |

(Continued)

(52) U.S. Cl.
CPC ... *H01L 31/035281* (2013.01); *H01L 27/1443* (2013.01); *H01L 27/14601* (2013.01); *H01L 27/14649* (2013.01); *H01L 27/14683* (2013.01); *H01L 31/02162* (2013.01); *H01L 31/108* (2013.01); *H01L 31/113* (2013.01); *H01L 31/18* (2013.01)

(58) Field of Classification Search
CPC .......... H01L 2224/32145; H01L 2924/12032; H01L 2224/16145; H01L 27/14629; H01L 31/035227; B82Y 30/00; B82Y 40/00

USPC ....................................................... 250/338.4
See application file for complete search history.

(56) References Cited

U.S. PATENT DOCUMENTS

| | | |
|---|---|---|
| 1,918,848 A | 7/1933 | Land |
| 3,903,427 A | 9/1975 | Pack |

(Continued)

FOREIGN PATENT DOCUMENTS

| | | |
|---|---|---|
| CN | 1624925 | 6/2005 |
| CN | 1306619 | 3/2007 |

(Continued)

OTHER PUBLICATIONS

CMOS image sensor pixel microlens array optimization using FDTD Solutions, http://www.lumerical_com/fdtd_microlens/cmos_image_sensor_pixel_microlens.php, pp. 1-2, Jun. 25, 2008.

(Continued)

*Primary Examiner* — David J Makiya
*Assistant Examiner* — Taeho Jo
(74) *Attorney, Agent, or Firm* — Pillsbury Winthrop Shaw Pittman LLP

(57) ABSTRACT

Photodetector devices and methods for making the photodetector devices are disclosed herein. In an embodiment, the device may include a substrate; and one or more core structures, each having one or more shell layers disposed at least on a portion of a sidewall of the core structure. Each of the one or more structures extends substantially perpendicularly from the substrate. Each of the one or more core structures and the one or more shell layers form a Schottky barrier junction or a metal-insulator-semiconductor (MiS) junction.

38 Claims, 18 Drawing Sheets

(51) Int. Cl.
*H01L 27/146* (2006.01)
*H01L 27/144* (2006.01)

(56) References Cited

U.S. PATENT DOCUMENTS

| | | | |
|---|---|---|---|
| 4,017,332 A | 4/1977 | James |
| 4,292,512 A | 9/1981 | Miller |
| 4,316,048 A | 2/1982 | Woodall |
| 4,357,415 A | 11/1982 | Hartman |
| 4,387,265 A | 6/1983 | Dalal |
| 4,394,571 A | 7/1983 | Jurisson |
| 4,400,221 A | 8/1983 | Rahilly |
| 4,443,890 A | 4/1984 | Eumurian |
| 4,513,168 A | 4/1985 | Borden |
| 4,531,055 A | 7/1985 | Shepherd, Jr. |
| 4,620,237 A | 10/1986 | Traino |
| 4,678,772 A | 7/1987 | Segal |
| 4,827,335 A | 5/1989 | Saito |
| 4,846,556 A | 7/1989 | Haneda |
| 4,857,973 A | 8/1989 | Yang |
| 4,876,586 A | 10/1989 | Dyck |
| 4,880,613 A | 11/1989 | Satoh |
| 4,896,941 A | 1/1990 | Hayashi |
| 4,950,625 A | 8/1990 | Nakashima |
| 4,971,928 A | 11/1990 | Fuller |
| 4,972,244 A | 11/1990 | Buffet |
| 4,990,988 A * | 2/1991 | Lin ............... H01L 27/14881 257/215 |
| 5,001,530 A * | 3/1991 | Kurianski ...... H01L 27/14875 257/217 |
| 5,071,490 A | 12/1991 | Yokota |
| 5,081,049 A | 1/1992 | Green |
| 5,096,520 A | 3/1992 | Faris |
| 5,124,543 A | 6/1992 | Kawashima |
| 5,217,911 A * | 6/1993 | Denda ............ H01L 29/66143 216/51 |
| 5,247,349 A | 9/1993 | Olego |
| 5,272,518 A | 12/1993 | Vincent |
| 5,311,047 A | 5/1994 | Chang |
| 5,347,147 A | 9/1994 | Jones |
| 5,362,972 A | 11/1994 | Yazawa |
| 5,374,841 A | 12/1994 | Goodwin |
| 5,391,896 A | 2/1995 | Wanlass |
| 5,401,968 A | 3/1995 | Cox |
| 5,449,626 A | 9/1995 | Hezel |
| 5,468,652 A | 11/1995 | Gee |
| 5,602,661 A | 2/1997 | Schadt |
| 5,612,780 A | 3/1997 | Rickenbach |
| 5,635,738 A * | 6/1997 | Shoda ............ H01L 27/14831 257/218 |
| 5,671,914 A | 9/1997 | Kalkhoran |
| 5,696,863 A | 12/1997 | Kleinerman |
| 5,723,945 A | 3/1998 | Schermerhorn |
| 5,747,796 A | 5/1998 | Heard |
| 5,767,507 A | 6/1998 | Unlu |
| 5,798,535 A | 8/1998 | Huang |
| 5,814,873 A * | 9/1998 | Konuma ............ H01L 31/108 257/449 |
| 5,844,290 A | 12/1998 | Furumiya |
| 5,853,446 A | 12/1998 | Carre |
| 5,857,053 A | 1/1999 | Kane |
| 5,877,492 A | 3/1999 | Fujieda |
| 5,880,495 A | 3/1999 | Chen |
| 5,885,881 A | 3/1999 | Ojha |
| 5,900,623 A | 5/1999 | Tsang |
| 5,943,463 A | 8/1999 | Unuma |
| 5,968,528 A | 10/1999 | Deckner |
| 6,013,871 A | 1/2000 | Curtin |
| 6,033,582 A | 3/2000 | Lee |
| 6,037,243 A | 3/2000 | Ha |
| 6,046,466 A | 4/2000 | Ishida |
| 6,074,892 A | 6/2000 | Bowers |
| 6,100,551 A | 8/2000 | Lee |
| 6,270,548 B1 | 8/2001 | Campbell |
| 6,301,420 B1 | 10/2001 | Greenaway |
| 6,326,649 B1 | 12/2001 | Chang |
| 6,388,243 B1 | 5/2002 | Berezin |
| 6,388,648 B1 | 5/2002 | Clifton |
| 6,407,439 B1 | 6/2002 | Hier |
| 6,459,034 B2 | 10/2002 | Muramoto |
| 6,463,204 B1 | 10/2002 | Ati |
| 6,542,231 B1 | 4/2003 | Garrett |
| 6,563,995 B2 | 5/2003 | Kane |
| 6,566,723 B1 | 5/2003 | Vook |
| 6,680,216 B2 | 1/2004 | Kwasnick |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,904,187 B2 | 6/2005 | Fischer et al. |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher |
| 7,064,372 B2 | 6/2006 | Duan |
| 7,105,428 B2 | 9/2006 | Pan |
| 7,106,938 B2 | 9/2006 | Baek et al. |
| 7,109,517 B2 | 9/2006 | Zaidi |
| 7,153,720 B2 | 12/2006 | Augusto |
| 7,163,659 B2 | 1/2007 | Stasiak |
| 7,192,533 B2 | 3/2007 | Bakkers |
| 7,208,783 B2 | 4/2007 | Palsule |
| 7,230,286 B2 | 6/2007 | Cohen |
| 7,235,475 B2 | 6/2007 | Kamins |
| 7,241,434 B2 | 7/2007 | Anthony |
| 7,253,017 B1 | 8/2007 | Roscheisen |
| 7,254,151 B2 | 8/2007 | Lieber |
| 7,262,400 B2 | 8/2007 | Yaung |
| 7,265,328 B2 | 9/2007 | Mouli |
| 7,272,287 B2 | 9/2007 | Bise |
| 7,285,812 B2 | 10/2007 | Tang |
| 7,306,963 B2 | 12/2007 | Linden |
| 7,307,327 B2 | 12/2007 | Bahl |
| 7,311,889 B2 | 12/2007 | Awano |
| 7,326,915 B2 | 2/2008 | Kaluzhny |
| 7,330,404 B2 | 2/2008 | Peng |
| 7,335,962 B2 | 2/2008 | Mouli |
| 7,336,860 B2 | 2/2008 | Cyr |
| 7,339,110 B1 | 3/2008 | Mulligan et al. |
| 7,358,583 B2 | 4/2008 | Reznik |
| 7,381,966 B2 | 6/2008 | Starikov |
| 7,388,147 B2 | 6/2008 | Mulligan |
| 7,416,911 B2 | 8/2008 | Heath |
| 7,446,025 B2 | 11/2008 | Cohen |
| 7,462,774 B2 | 12/2008 | Roscheisen |
| 7,471,428 B2 | 12/2008 | Ohara |
| 7,491,269 B2 | 2/2009 | Legagneux |
| 7,507,293 B2 | 3/2009 | Li |
| 7,521,322 B2 | 4/2009 | Tang |
| 7,524,694 B2 | 4/2009 | Adkisson |
| 7,582,857 B2 | 9/2009 | Gruev |
| 7,598,482 B1 | 10/2009 | Verhulst |
| 7,622,367 B1 | 11/2009 | Nuzzo |
| 7,626,685 B2 | 12/2009 | Jin |
| 7,646,138 B2 | 1/2010 | Williams |
| 7,646,943 B1 | 1/2010 | Wober |
| 7,647,695 B2 | 1/2010 | MacNutt |
| 7,649,665 B2 | 1/2010 | Kempa |
| 7,655,860 B2 | 2/2010 | Parsons |
| 7,663,202 B2 | 2/2010 | Wang |
| 7,692,860 B2 | 4/2010 | Sato |
| 7,704,806 B2 | 4/2010 | Chae |
| 7,713,779 B2 | 5/2010 | Firon |
| 7,719,678 B2 | 5/2010 | Kamins |
| 7,719,688 B2 | 5/2010 | Kamins |
| 7,732,769 B2 | 6/2010 | Snider |
| 7,732,839 B2 | 6/2010 | Sebe |
| 7,736,954 B2 | 6/2010 | Hussain |
| 7,740,824 B2 | 6/2010 | Godfried |
| 7,790,495 B2 | 9/2010 | Assefa |

(56) References Cited

U.S. PATENT DOCUMENTS

| | | |
|---|---|---|
| 7,872,324 B2 | 1/2011 | Kim |
| 7,888,155 B2 | 2/2011 | Chen |
| 7,902,540 B2 | 3/2011 | Cohen |
| 7,948,555 B2 | 5/2011 | Kwon et al. |
| 8,030,729 B2 | 10/2011 | Quitoriano |
| 8,035,184 B1 | 10/2011 | Dutta |
| 8,049,203 B2 | 11/2011 | Samuelson |
| 8,063,450 B2 | 11/2011 | Wernersson |
| 8,067,299 B2 | 11/2011 | Samuelson |
| 8,067,736 B2 | 11/2011 | Gruss |
| 8,084,728 B2 | 12/2011 | Tsang |
| 8,093,675 B2 | 1/2012 | Tsunemi |
| 8,118,170 B2 | 2/2012 | Sato |
| 8,143,658 B2 | 3/2012 | Samuelson |
| 8,154,127 B1 | 4/2012 | Kamins |
| 8,193,524 B2 | 6/2012 | Bjoerk |
| 8,208,776 B2 | 6/2012 | Tokushima |
| 8,212,138 B2 | 7/2012 | Landis |
| 8,222,705 B2 | 7/2012 | Ogino |
| 8,242,353 B2 | 8/2012 | Karg |
| 8,269,985 B2 | 9/2012 | Wober |
| 8,274,039 B2 | 9/2012 | Wober |
| 8,293,597 B2 * | 10/2012 | Raaijmakers ......... C23C 16/405 257/E21.632 |
| 8,299,472 B2 | 10/2012 | Yu |
| 8,330,090 B2 | 12/2012 | Agarwal |
| 8,384,007 B2 | 2/2013 | Yu |
| 8,455,857 B2 | 6/2013 | Samuelson |
| 8,471,190 B2 | 6/2013 | Wober |
| 8,514,411 B2 | 8/2013 | Wober |
| 8,546,742 B2 | 10/2013 | Wober |
| 8,748,799 B2 | 6/2014 | Wober |
| 8,766,272 B2 | 7/2014 | Yu et al. |
| 8,791,470 B2 | 7/2014 | Wober |
| 8,810,808 B2 | 8/2014 | Wober |
| 8,835,831 B2 | 9/2014 | Yu et al. |
| 8,866,065 B2 | 10/2014 | Wober |
| 9,000,353 B2 | 4/2015 | Seo |
| 2002/0003201 A1 | 1/2002 | Yu |
| 2002/0020846 A1 | 2/2002 | Pi |
| 2002/0021879 A1 | 2/2002 | Lee |
| 2002/0071468 A1 | 6/2002 | Sandstrom |
| 2002/0104821 A1 | 8/2002 | Bazylenko |
| 2002/0109082 A1 | 8/2002 | Nakayama |
| 2002/0117675 A1 | 8/2002 | Mascarenhas |
| 2002/0130311 A1 | 9/2002 | Lieber |
| 2002/0172820 A1 * | 11/2002 | Majumdar ............. B82Y 10/00 428/357 |
| 2003/0003300 A1 | 1/2003 | Korgel |
| 2003/0006363 A1 | 1/2003 | Campbell |
| 2003/0077907 A1 | 4/2003 | Kao |
| 2003/0089899 A1 | 5/2003 | Lieber |
| 2003/0103744 A1 | 6/2003 | Koyama |
| 2003/0132480 A1 | 7/2003 | Chau |
| 2003/0160176 A1 | 8/2003 | Vispute |
| 2003/0189202 A1 | 10/2003 | Li |
| 2003/0227090 A1 | 12/2003 | Okabe |
| 2004/0011975 A1 | 1/2004 | Nicoli |
| 2004/0021062 A1 | 2/2004 | Zaidi |
| 2004/0026684 A1 | 2/2004 | Empedocles |
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0095658 A1 | 5/2004 | Buretea |
| 2004/0109666 A1 | 6/2004 | Kim |
| 2004/0114847 A1 | 6/2004 | Fischer et al. |
| 2004/0118337 A1 | 6/2004 | Mizutani |
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1 | 8/2004 | Charlton |
| 2004/0160522 A1 | 8/2004 | Fossum |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0252957 A1 | 12/2004 | Schmidt et al. |
| 2004/0261840 A1 | 12/2004 | Schmit |
| 2005/0009224 A1 | 1/2005 | Yang |
| 2005/0035381 A1 | 2/2005 | Holm |
| 2005/0082676 A1 | 4/2005 | Andry |
| 2005/0087601 A1 | 4/2005 | Gerst |
| 2005/0095699 A1 * | 5/2005 | Miyauchi ......... B01L 3/502761 435/299.1 |
| 2005/0109388 A1 | 5/2005 | Murakami |
| 2005/0116271 A1 | 6/2005 | Kato |
| 2005/0133476 A1 | 6/2005 | Islam |
| 2005/0161662 A1 | 7/2005 | Majumdar |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0224707 A1 | 10/2005 | Guedj |
| 2005/0242409 A1 | 11/2005 | Yang |
| 2005/0284517 A1 | 12/2005 | Shinohara |
| 2006/0011362 A1 | 1/2006 | Tao |
| 2006/0027071 A1 | 2/2006 | Barnett |
| 2006/0038990 A1 | 2/2006 | Habib |
| 2006/0113622 A1 | 6/2006 | Adkisson |
| 2006/0115230 A1 | 6/2006 | Komoguchi et al. |
| 2006/0121371 A1 | 6/2006 | Wu |
| 2006/0146323 A1 | 7/2006 | Bratkovski |
| 2006/0162766 A1 | 7/2006 | Gee |
| 2006/0175601 A1 * | 8/2006 | Lieber ................ B82Y 10/00 257/19 |
| 2006/0180197 A1 | 8/2006 | Gui |
| 2006/0208320 A1 * | 9/2006 | Tsuchiya ......... H01L 21/823835 257/371 |
| 2006/0257071 A1 | 11/2006 | Bise |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1 | 1/2007 | Duan |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1 | 5/2007 | Ahn |
| 2007/0107773 A1 | 5/2007 | Fork |
| 2007/0108371 A1 | 5/2007 | Stevens |
| 2007/0114622 A1 | 5/2007 | Adkisson |
| 2007/0120254 A1 | 5/2007 | Hurkx |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1 | 6/2007 | Adkisson |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0164270 A1 | 7/2007 | Majumdar |
| 2007/0170418 A1 | 7/2007 | Bowers |
| 2007/0172623 A1 | 7/2007 | Kresse |
| 2007/0172970 A1 | 7/2007 | Uya |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya |
| 2007/0238265 A1 | 10/2007 | Kurashina |
| 2007/0238285 A1 | 10/2007 | Borden |
| 2007/0241260 A1 | 10/2007 | Jaeger |
| 2007/0246689 A1 | 10/2007 | Ge |

(56) References Cited

U.S. PATENT DOCUMENTS

| | | |
|---|---|---|
| 2007/0248958 A1 | 10/2007 | Jovanovich |
| 2007/0272828 A1 | 11/2007 | Xu |
| 2007/0278500 A1 | 12/2007 | Lin |
| 2007/0285378 A1 | 12/2007 | Lankhorst |
| 2007/0290193 A1 | 12/2007 | Tucker |
| 2007/0290265 A1 | 12/2007 | Augusto |
| 2008/0001498 A1 | 1/2008 | Muller |
| 2008/0006319 A1 | 1/2008 | Bettge |
| 2008/0029701 A1 | 2/2008 | Onozawa |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar |
| 2008/0055451 A1 | 3/2008 | Kanbe |
| 2008/0065451 A1 | 3/2008 | For |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0137188 A1 | 6/2008 | Sato et al. |
| 2008/0143906 A1 | 6/2008 | Allemand et al. |
| 2008/0145965 A1 | 6/2008 | Reznik |
| 2008/0149914 A1 | 6/2008 | Samuelson |
| 2008/0149944 A1 | 6/2008 | Samuelson |
| 2008/0157253 A1 | 7/2008 | Starikov |
| 2008/0166883 A1 | 7/2008 | Liu |
| 2008/0169017 A1 | 7/2008 | Korevaar |
| 2008/0169019 A1 | 7/2008 | Korevaar |
| 2008/0173615 A1 | 7/2008 | Kim |
| 2008/0178924 A1 | 7/2008 | Kempa |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0264478 A1 | 10/2008 | Ahn |
| 2008/0266556 A1 | 10/2008 | Kamins |
| 2008/0266572 A1 | 10/2008 | Kamins |
| 2008/0271783 A1 | 11/2008 | Murakami |
| 2008/0277646 A1 | 11/2008 | Kim |
| 2008/0283728 A1 | 11/2008 | Inoue |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwar |
| 2009/0001498 A1 | 1/2009 | Wang |
| 2009/0020150 A1 | 1/2009 | Atwater |
| 2009/0020687 A1 | 1/2009 | Lehmann et al. |
| 2009/0032687 A1 | 2/2009 | Lapstun |
| 2009/0046362 A1 | 2/2009 | Guo |
| 2009/0046749 A1 | 2/2009 | Mizuuchi |
| 2009/0050204 A1 | 2/2009 | Habib |
| 2009/0052029 A1 | 2/2009 | Dai et al. |
| 2009/0057650 A1 | 3/2009 | Lieber |
| 2009/0072145 A1 | 3/2009 | Peczalski |
| 2009/0104160 A1 | 4/2009 | Young |
| 2009/0120498 A1 | 5/2009 | Yamazaki |
| 2009/0121136 A1 | 5/2009 | Gruss |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami |
| 2009/0165844 A1 | 7/2009 | Dutta |
| 2009/0173976 A1 | 7/2009 | Augusto |
| 2009/0179225 A1 | 7/2009 | Fertig |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Wang |
| 2009/0194160 A1 | 8/2009 | Chin |
| 2009/0199597 A1 | 8/2009 | Danley |
| 2009/0201400 A1 | 8/2009 | Zhang |
| 2009/0206405 A1 | 8/2009 | Doyle |
| 2009/0211622 A1 | 8/2009 | Frolov |
| 2009/0223558 A1 | 9/2009 | Sun |
| 2009/0224245 A1 | 9/2009 | Umezaki |
| 2009/0224349 A1 | 9/2009 | Gambino |
| 2009/0230039 A1 | 9/2009 | Hoenig |
| 2009/0233445 A1 | 9/2009 | Lee |
| 2009/0242018 A1 | 10/2009 | Ahn |
| 2009/0243016 A1 | 10/2009 | Kawahara |
| 2009/0244514 A1 | 10/2009 | Jin |
| 2009/0260687 A1 | 10/2009 | Park |
| 2009/0261438 A1 | 10/2009 | Choi |
| 2009/0266418 A1 | 10/2009 | Hu |
| 2009/0266974 A1 | 10/2009 | Verhulst |
| 2009/0272423 A1 | 11/2009 | Niira |
| 2009/0278998 A1 | 11/2009 | El-Ghoroury |
| 2009/0289320 A1 | 11/2009 | Cohen |
| 2009/0305454 A1 | 12/2009 | Cohen |
| 2010/0006817 A1 | 1/2010 | Ohlsson |
| 2010/0019252 A1 | 1/2010 | Bratkovski |
| 2010/0019296 A1 | 1/2010 | Cha |
| 2010/0019355 A1 | 1/2010 | Kamins |
| 2010/0025710 A1 | 2/2010 | Yamada |
| 2010/0078055 A1 | 4/2010 | Vidu |
| 2010/0078056 A1 | 4/2010 | Hovel |
| 2010/0090341 A1 | 4/2010 | Wan |
| 2010/0101633 A1 | 4/2010 | Park |
| 2010/0104494 A1 | 4/2010 | Meng |
| 2010/0110433 A1 | 5/2010 | Nedelcu et al. |
| 2010/0116976 A1 | 5/2010 | Wober |
| 2010/0126573 A1 | 5/2010 | Youtsey |
| 2010/0127153 A1 | 5/2010 | Agarwal |
| 2010/0132779 A1 | 6/2010 | Hong |
| 2010/0133986 A1 | 6/2010 | Kim |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0240104 A1 | 9/2010 | Xiao |
| 2010/0244108 A1 | 9/2010 | Kohnke |
| 2010/0244169 A1 | 9/2010 | Maeda |
| 2010/0249877 A1* | 9/2010 | Naughton ............ B82Y 20/00 607/54 |
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1* | 11/2010 | Wang .................... B82Y 20/00 257/21 |
| 2010/0302440 A1 | 12/2010 | Wober |
| 2010/0304061 A1 | 12/2010 | Ye |
| 2010/0304204 A1* | 12/2010 | Routkevitch ........... C01B 3/042 429/122 |
| 2010/0308214 A1 | 12/2010 | Wober |
| 2010/0313952 A1 | 12/2010 | Coakley |

(56) References Cited

U.S. PATENT DOCUMENTS

| | | |
|---|---|---|
| 2010/0319763 A1 | 12/2010 | Park |
| 2010/0320444 A1* | 12/2010 | Dutta .................. H01L 25/042 257/21 |
| 2011/0018424 A1 | 1/2011 | Takada |
| 2011/0036396 A1 | 2/2011 | Jayaraman |
| 2011/0037133 A1 | 2/2011 | Su |
| 2011/0049572 A1* | 3/2011 | Jeon .................... H01L 29/402 257/201 |
| 2011/0050042 A1 | 3/2011 | Choi |
| 2011/0057231 A1* | 3/2011 | Jeon .................. H01L 29/0692 257/183 |
| 2011/0057234 A1* | 3/2011 | Jeon .................. H01L 29/0692 257/194 |
| 2011/0057286 A1* | 3/2011 | Jeon .................... H01L 29/417 257/476 |
| 2011/0080508 A1 | 4/2011 | Katsuno |
| 2011/0084212 A1 | 4/2011 | Clark |
| 2011/0127490 A1 | 6/2011 | Mi |
| 2011/0133060 A1 | 6/2011 | Yu |
| 2011/0133160 A1 | 6/2011 | Yu |
| 2011/0135814 A1 | 6/2011 | Miyauchi |
| 2011/0139176 A1 | 6/2011 | Cheung |
| 2011/0146771 A1 | 6/2011 | Chuang |
| 2011/0147870 A1 | 6/2011 | Ang |
| 2011/0180894 A1 | 7/2011 | Samuelson |
| 2011/0195577 A1 | 8/2011 | Kushibiki |
| 2011/0220191 A1* | 9/2011 | Flood .................... B82Y 10/00 136/255 |
| 2011/0226937 A1 | 9/2011 | Yu |
| 2011/0237061 A1* | 9/2011 | Yamaguchi ....... H01L 21/28052 438/592 |
| 2011/0248315 A1 | 10/2011 | Nam |
| 2011/0249219 A1 | 10/2011 | Evans |
| 2011/0249322 A1 | 10/2011 | Wang |
| 2011/0253982 A1 | 10/2011 | Wang |
| 2011/0272014 A1* | 11/2011 | Mathai ............ H01L 31/035281 136/255 |
| 2011/0297214 A1 | 12/2011 | Kim |
| 2011/0309237 A1 | 12/2011 | Seo et al. |
| 2011/0309240 A1 | 12/2011 | Yu et al. |
| 2011/0309331 A1* | 12/2011 | Yu .................... H01L 27/1443 257/21 |
| 2011/0315988 A1* | 12/2011 | Yu .......................... H01L 27/14 257/52 |
| 2011/0316106 A1 | 12/2011 | Kim |
| 2012/0006390 A1 | 1/2012 | Huo et al. |
| 2012/0009714 A1 | 1/2012 | Mouli |
| 2012/0012968 A1* | 1/2012 | Konsek ............... H01L 29/0673 257/472 |
| 2012/0014837 A1 | 1/2012 | Fehr et al. |
| 2012/0029328 A1 | 2/2012 | Shimizu |
| 2012/0031454 A1 | 2/2012 | Fogel |
| 2012/0060905 A1 | 3/2012 | Fogel |
| 2012/0075513 A1 | 3/2012 | Chipman et al. |
| 2012/0126297 A1* | 5/2012 | Yamaguchi ....... H01L 21/28052 257/288 |
| 2012/0153124 A1 | 6/2012 | Yu |
| 2012/0192939 A1 | 8/2012 | Tamboli et al. |
| 2012/0196383 A1 | 8/2012 | Nitkowski et al. |
| 2012/0196401 A1* | 8/2012 | Graham .......... H01L 31/035227 438/98 |
| 2012/0240999 A1 | 9/2012 | Yoshida |
| 2012/0258563 A1 | 10/2012 | Ogino |
| 2012/0273747 A1* | 11/2012 | Saitoh ............. H01L 21/823431 257/5 |
| 2012/0280345 A1* | 11/2012 | Zhu .................... G02B 6/1226 257/432 |
| 2012/0298843 A1 | 11/2012 | Yu |
| 2012/0313078 A1* | 12/2012 | Fukui .................... B82Y 10/00 257/14 |
| 2012/0313188 A1* | 12/2012 | Kanegae ......... H01L 21/823425 257/412 |
| 2012/0318336 A1 | 12/2012 | Hekmatshoar-Tabari et al. |
| 2012/0322164 A1 | 12/2012 | Lal |
| 2013/0000704 A1 | 1/2013 | Fogel |
| 2013/0020620 A1 | 1/2013 | Wober |
| 2013/0037100 A1 | 2/2013 | Platzer Bjorkman |
| 2013/0112256 A1 | 5/2013 | Yu |
| 2013/0125965 A1 | 5/2013 | Hazeghi et al. |
| 2013/0174904 A1 | 7/2013 | Yamasaki |
| 2013/0220406 A1 | 8/2013 | Day |
| 2013/0341749 A1 | 12/2013 | Yu et al. |
| 2014/0045209 A1 | 2/2014 | Chou |
| 2014/0096816 A1* | 4/2014 | Atwater ............ H01L 31/02363 136/255 |
| 2014/0117401 A1 | 5/2014 | Herner |
| 2014/0175546 A1* | 6/2014 | Huffaker ......... H01L 31/022425 257/342 |
| 2014/0224989 A1* | 8/2014 | Long .................... G02F 1/0126 250/338.4 |
| 2014/0261604 A1* | 9/2014 | Jha ........................ H01L 35/22 136/200 |
| 2014/0330337 A1* | 11/2014 | Linke .................. A61N 1/3787 607/45 |
| 2015/0171272 A1 | 6/2015 | Luo |

FOREIGN PATENT DOCUMENTS

| | | |
|---|---|---|
| CN | 100350429 | 11/2007 |
| CN | 101221993 | 7/2008 |
| CN | 101459185 | 6/2009 |
| CN | 100568516 | 12/2009 |
| CN | 101675522 | 3/2010 |
| CN | 101681941 | 3/2010 |
| CN | 103201858 | 7/2013 |
| EP | 1367819 | 12/2003 |
| EP | 0809303 B1 | 9/2006 |
| FR | 2923651 | 5/2009 |
| GB | 2348399 A | 4/2000 |
| JP | 359013708 A | 1/1984 |
| JP | 59198413708 | 1/1984 |
| JP | 2000324396 | 11/2000 |
| JP | 2002151715 A | 5/2002 |
| JP | 2005252210 A | 9/2005 |
| JP | 2005328135 | 11/2005 |
| JP | 2007134562 | 5/2007 |
| JP | 2007152548 | 6/2007 |
| JP | 2007184566 | 7/2007 |
| JP | 2007520877 | 7/2007 |
| JP | 2007201091 | 8/2007 |
| JP | 2007317961 | 12/2007 |
| JP | 2008288585 | 11/2008 |
| JP | 2009506546 | 2/2009 |
| JP | 2009236914 | 10/2009 |
| JP | 2012543250 | 4/2013 |
| JP | 2013513253 | 4/2013 |
| JP | 2013513254 | 4/2013 |
| TW | I318418 | 5/2004 |
| TW | 1228782 | 3/2005 |
| TW | 200535914 | 11/2005 |
| TW | 200536048 | 11/2005 |
| TW | 200742115 | 4/2007 |
| TW | 200810100 | 2/2008 |
| TW | 200814308 | 3/2008 |
| TW | 200845402 | 11/2008 |
| TW | 200847412 | 12/2008 |
| TW | 200915551 | 4/2009 |
| TW | 200941716 | 10/2009 |
| TW | I320235 | 2/2010 |
| TW | 201027730 | 7/2010 |
| TW | 201034172 | 9/2010 |
| TW | 201044610 | 12/2010 |
| TW | 201140859 | 11/2011 |
| WO | 8603347 A1 | 6/1986 |
| WO | 0002379 | 1/2000 |
| WO | 02069623 | 9/2002 |
| WO | 03107439 | 12/2003 |
| WO | 03107439 A1 | 12/2003 |
| WO | 2005064337 | 7/2005 |
| WO | 2007000879 | 1/2007 |
| WO | 2008069565 | 6/2008 |
| WO | 2008079076 | 7/2008 |
| WO | 2008079076 A1 | 7/2008 |
| WO | 2008131313 A2 | 10/2008 |

(56) References Cited

FOREIGN PATENT DOCUMENTS

| WO | 2008135905 | | 11/2008 |
|---|---|---|---|
| WO | 2008135905 | A2 | 11/2008 |
| WO | 2008135905 | A3 | 11/2008 |
| WO | 2008143727 | A2 | 11/2008 |
| WO | 2008131313 | | 12/2008 |
| WO | 2009099841 | | 8/2009 |
| WO | 2009116018 | A2 | 9/2009 |
| WO | 2009137241 | A2 | 11/2009 |
| WO | 2010014099 | | 2/2010 |
| WO | 2010019887 | A1 | 2/2010 |
| WO | 2010039631 | A1 | 4/2010 |
| WO | 2010067958 | | 8/2010 |
| WO | 2011074457 | | 6/2011 |

OTHER PUBLICATIONS

Adler, Nanowire Lawns Make for Sheets of Image Sensors, NewScientist.com, Jul. 28, 2008.

Babinec et al., High-Flux, Low-Power Diamond Nanowire Single-Photon Source Arrays: An Enabling Material for Optical and Quantum Computing and Cryptography, obtained on Jul. 22, 2010 at URL: http://otd.harvard.edu/technologies/tech.php?case=3702.

Baillie et al., 'Zero-space microlenses for CMOS image sensors: optical modeling and lithographic process development', Publication Date May 2004, http://adsabs.harvard.edu/abs/2004SPIE.5377..953B, pp. 1-2.

Barclay et al., Chip-Based Microcavities Coupled to NV Centers in Single Crystal Diamond, Applied Physics Letters, Nov. 12, 2009, vol. 95, Issue 19.

Brouri et al., Photon Antibunching in the Flurescence of Individual Colored Centers in Diamond, Optics Letters, Sep. 1, 2000, vol. 25, Issue 17.

Chung, Sung-Wook et al. Silicon Nanowire Devices. Applied Physics Letters, vol. 76, No. 15 (Apr. 10, 2000), pp. 2068-2070.

CMOS image sensor pixel optical efficiency and optical crosstalk optimization using FDTD Solutions' www.lumerical.com/fdtd_microlens/cmos_image_sensor_pixel_microlens.php, Mar. 19, 2009.

Deptuch et al., Vertically Integrated Circuits at Fermilab, IEEE Transactions on Nuclear Science, Aug. 2010, vol. 54, Issue 4, pp. 2178-2186.

Ekroll, On the Nature of Simultaneous Color Contrast, Dissertation, University of Kiel, 2005.

Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.

Fang et al., Fabrication of Slantingly-Aligned Silicon Nanowire Arrays for Solar Cell Applications, Nanotechnology, vol. 19, No. 25. 2008.

Furumiya, et al. 'High-sensitivity and no-crosstalk pixel technology for embedded CMOS image sensor'; IEEE Electron Device Letters, vol. 48, No. 10, Oct. 2001.

Gadelrab et al., The Source-Gated Amorphous Silicon Photo-Transistor, IEEE Transactions on Electron Devices, Oct. 1997, vol. 44, No. 10, pp. 1789-1794.

Gambino et al., 'CMOS Imager with Copper Wiring and Lightpipe,' Electron Devices Meeting, 2006. IEDM '06, International Publication Date: Dec. 11-13, 2006, pp. 1-4.

Garnett et al., Light Trapping in Silicon Nanowire Solar Cells, Nanoletters, Jan. 28, 2010, vol. 10, No. 3, pp. 1082-1087.

Ge et al., Orientation-Controlled Growth of Single-Crystal Silicon-Nanowire Arrays, Advanced Materials, Jan. 18, 2005, vol. 17, No. 1, pp. 56-61.

Guillaumee, et al.; Polarization Sensitive Silicon Photodiodes Using Nanostructured Metallic Grids, Applied Physics Letters 94, 2009.

Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.

Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.

Hochbaum et al., Controlled Growth of Si Nanowire Arrays for Device Integration, Nano Letters, Mar. 2005, vol. 5, No. 3, pp. 457-460.

Holmes et al., Control of Thickness and Orientation of Solution-Grown Silicon Nanowires, Science, Feb. 25, 2000, vol. 287, No. 5457, pp. 1471-1473.

Hsu, et al. 'Light Guide for Pixel Crosstalk Improvement in Deep Submicron CMOS Image Sensor'; IEEE Electron Device Letters, vol. 25, No. 1, Jan. 2004.

International Preliminary Report on Patentability for PCT International Application No. PCT/US2010/035722, mailed Nov. 3, 2011.

International Preliminary Report on Patentability for PCT International Patent Application No. PCT/U62009/055963, mailed Mar. 17, 2011.

International Search Report and Written Opinion for PCT International Application No. PCT/US2010/035722, mailed Jul. 20, 2010.

International Search Report and Written Opinion for PCT International Application No. PCT/US2010/035726, mailed Jul. 21, 2010.

International Search Report and Written Opinion for PCT International Patent Application No. PCT/US2009/055963, mailed Oct. 15, 2009.

International Search Report and Written Opinion for PCT International Patent Application No. PCT/US2009/063592, mailed Jan. 13, 2010.

International Search Report and Written Opinion for PCT International Patent Application No. PCT/US2010/035727, mailed Sep. 27, 2010.

International Search Report and Written Opinion for PCT International Patent Application No. PCT/US2010/051435, mailed Dec. 3, 2010.

International Search Report and Written Opinion for PCT International Patent Application No. PCT/US2010/051446, mailed Jan. 3, 2011.

International Search Report and Written Opinion for PCT International Patent Application No. PCT/US2010/057227, mailed Jan. 26, 2011.

International Search Report and Written Opinion for PCT International Patent Application No. PCT/US2010/059468, mailed Feb. 11, 2011.

International Search Report and Written Opinion for PCT International Patent Application No. PCT/US2010/059491, mailed Feb. 9, 2011.

International Search Report and Written Opinion for PCT International Patent Application No. PCT/US2010/059501, mailed Feb. 15, 2011.

International Search Report and Written Opinion for PCT International Patent Application No. PCT/US2010/059504, mailed Apr. 7, 2011.

International Search Report and Written Opinion for PCT International Patent Application No. PCT/US2011/060348, mailed Mar. 9, 2012.

International Search Report and Written Opinion for PCT International Patent Application No. PCT/US2011/064635, mailed Apr. 13, 2012.

International Search Report and Written Opinion for PCT International Patent Application No. PCT/US2011/066097, mailed Mar. 12, 2012.

International Search Report and Written Opinion for PCT International Patent Application No. PCT/US2011/067712, mailed May 3, 2012.

Jin-Kon Kim; 'New Functional Nanomaterials Based on Block Copolymers' http://www.ziu.edu.cn/adver/subjectizyhd/jz0707061313.html, Jul. 11, 2007.

Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.

Junger, et al., Polarization- and wavelength-sensitive sub-wavelength structures fabricated in the metal layers of deep submicron CMOS processes, Proc. of SPIE, vol. 7712, 2010.

(56) References Cited

OTHER PUBLICATIONS

Kalkofen et al., Atomic Layer Deposition of Boron Oxide as Dopant Source for Shallow Doping Silicon, Meeting Abstract 943, 217th ECS Meeting MP2010-O1 , Apr. 25-30, 2010 Vancouver Canada, EI—Advanced Gate Stack, Source / Drain, and Channel Engineering for Si-Based CMOS 6: New Materials, Processes,and Equipment.
Kane, Why Nanowires Make Great Photodetectors, EurekAlert.com article, Apr. 25, 2007.
Kempa, Thomas J. et al. Single and Tandem Axial p-i-n. Nanowire Photovoltaic Devices, Nano Letters, 2008, vol. 8, No. 10, 3456-3460.
Kim et al., Electronic Structure of Vertically Aligned Mn-Doped $CoFe_2O_4$ Nanowires and Their Application as Humidity Sensors and Photodetectors, Journal of Physical Chemistry C, Apr. 7, 2009.
Law et al., Semiconductor Nanowires and Nanotubes, Annu. Rev. Mater. Res., 2004, vol. 34, pp. 83-122.
Lee et al., Vertical Pillar-Superlattice Array and Graphene Hybrid Light Emitting Diodes, Nano Letters, 2010, vol. 10, pp. 2783-2788.
Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.
Lin et al., Reducing Dark Current in a High-Speed Si-Based Interdigitated Trench-Electrode Msm Photodetector, IEEE Transactions on Electron Devices, May 2003, vol. 50, No. 5, pp. 1306-1313.
Loncar et al., Diamond Nanotechnology, SPIE Newsroom, May 18, 2010, obtained at url: http://spie.org/x40194.xml?ArticleID=x40194.
Loose et al., CMOS Detector technology, Scientific Technology, Scientific Detector Workshop, Sicily 2005, Experimental Astronomy, vol. 19, Issue 1-3, pp. 111-134.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., Press, 2002, pp. 125-204. CRC.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Morales et al., A Laser Ablation Method for the Synthesis of Crystalline Semiconductor Nanowires, Science, Jan. 9, 1998, vol. 279, pp. 208-211.
N. L. Dmitruk, et al.; 'Modeling and Measurement of Optical Response of 1D Array of Metallic Nanowires for Sensing and Detection Application'; 26th International Conference on Microelectronics (MIEL 2008), NIS, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.
Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Reynard Corporation; 'Anti-Reflection Coatings (AR)', http://www.reynardcorp.com/coating_anti_reflection.php, dowwnloaded Jun. 4, 2009.
Rosfjord et al., Nanowire Single-Photon Detector with an Integrated Optical Cavity and Anti-Reflection Coating, Optics Express: The International Electronic Journal of Optics; Jan. 23, 2006, vol. 14, No. 2, pp. 527-534.
Rugani, First All-Nanowire Sensor, Technology Review, Aug. 13, 2008, Published by MIT.
Rutter, Diamond-Based Nanowire Devices Advance Quantum Science, SEAS Communications, Feb. 14, 2010, obtained at url:http://news.harvard.edu/gazette/story/2010/02/digging-deep-into-diamonds/.
Sarkar et al., Integrated polarization-analyzing CMOS image sensor for detecting incoming light ray direction, Sensors Application Symposium (SAS), Mar. 29, 2012, p. 194-199, 1010 IEEE.
Schmidt et al., Realization of a Silicon Nanowire Vertical Surround-Gate Field-Effect Effect Transistor, Small, Jan. 2006, vol. 2, No. 1, pp. 85-88.
Shimizu et al., Homoepitaxial Growth of Vertical Si Nanowires on Si(100) Substrate using Anodic Aluminum Oxide Template, (abstract only), Materials Research Society, Fall 2007.
Shockley, et al., Detailed Balance Limit of Efficiency of p-n Junction Solar Cells, J. of Appl. Physics, vol. 32, No. 3, Mar. 1961, 10 pages.
Song et al., Vertically Standing Ge Nanowires on GaAs(110) Substrates, Nanotechnology 19, Feb. 21, 2008.
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.
Tseng, et al. Crosstalk improvement technology applicable to 0.14m CMOS image sensor; IEEE International Electron Devices Meeting, Dec. 13-15, 2004; IEDM Technical Digest, pp. 997-1000.
Verheijen, Marcel A. et al. Growth Kinetics of Heterostructured GaP—GaAs Nanowires. J. Am, Chem. Soc. 2006, 128, 1353-1359.
Wagner et al., Vapor-Liquid-Solid Mechanism of Single Crystal Growth, Applied Physics Letters, Mar. 1, 1964, vol. 4, No. 5, pp. 89-90.
Wang, Introduction to Nanotechnology—Where Opportunities arise & Great Future Being Built from Small Things, Fall 2008.
Wong et al., Lateral Nanoconcentrator Nanowire Multijunction Photovoltaic Cells, GCEP Progress report, Apr. 20, 2009, pp. 1-18.
Ye et al., Fabrication Techniques of High Aspect Ratio Vertical Lightpipes Using a Dielectric Photo Mask, SPIE, Proceedings, Feb. 2010, vol. 7591.
Zhang et al., Ultrahigh Responsivity Visible and Infrared Detection Using Silicon Nanowire Phototransistors, Nanoletters, May 14, 2010, vol. 10, No. 6, pp. 2117-2120.
Baomin, et al., Nanotechology 23 (2012) 194003, 7 pages.
International Preliminary Report and Written Opinion re PCT/US2010/059468, mailed Jun. 21, 2012.
International Preliminary Report and Written Opinion re PCT/US2010/059491, mailed Jun. 21, 2012.
International Preliminary Report and Written Opinion re PCT/US2010/059496, mailed Jun. 21, 2012.
International Search Report and Written Opinion re PCT/US2011/57325, mailed Jun. 22, 2012.
Jeong, et al., Nano Lett. 2012, 12, 2971-2976.
Jeong et al., J. Vac. Sci. Technol. A 30(6), Nov./Dec. 2012.
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.
U.S. Office Action for U.S. Appl. No. 12/573,582, dated Jun. 28, 2012.
U.S. Office Action for U.S. Appl. No. 13/494,661, notification date Nov. 7, 2012.
Canadian Office Action of Canadian Application No. 3,676,376, dated Oct. 11, 2013.
Catrysse, et al., An Integrated Color Pixel in 0.18pm CMOS Technology, Proceedings IEDM 2001, pp. 559-562.
Choi et al., Optimization of sidewall roughness in silica waveguides to reduce propagation losses, May 2001, Lasers and Electro-Optics,

(56) References Cited

OTHER PUBLICATIONS

2001. CLEO '01. Technical Digest. Summaries of papers presented at the Conference on, pp. 175-176.
Geyer et al., Model for the Mass Transport during Metal-Assisted Chemical Etching with Contiguous Metal Films as Catalysts, J. Phys. Chem. C 2012, 116, 13446-13451.
Hopkins, Addressing sidewall roughness using dry etching silicon and Si02, Jul. 1, 2004, ElectroIQ, vol. 47, Issue 7.
International Preliminary Search Report on Patentability of PCT/US2011/057325, mailed May 2, 2013 (9 pages).
Mei-Ling Kuo et al. "Realization of a near-perfect antireflection coating for silicon solar energy utilization" (Nov. 1, 2008, vol. 33, No. 21, Optics Letters).
Mukhopadhyay, When PDMS Isn't the Best, American Chemical Society, May 1, 2007.
Seo, et. al., "Multicolored vertical silicon nanowires," Nano Letters, \tali 1 issue 4, pp. 1851-1856, 2010.
Taiwanese Office Action of Taiwan Patent Application No. 099116881, issued Jul. 18, 2013 (8 pages).
U.S. Office Action for U.S. Appl. No. 12/633,313, dated Aug. 1, 2013, 20 pages.
U.S. Office Action for U.S. Appl. No. 12/966,514, dated Aug. 15, 2013, 17 pages.
U.S. Office Action for U.S. Appl. No. 12/966,535, mailed Jun. 14, 2013, 22 pages.
U.S. Office Action for U.S. Appl. No. 12/966,573, dated Aug. 6, 2013, 13 pages.
U.S. Office Action for U.S. Appl. No. 13/048,635, mailed Jun. 6, 2013, 24 pages.
Office Action issued on Jan. 28, 2014 in Taiwanese Application No. 100146327.
Office Action issued on Mar. 17, 2014 in Korean Application No. 10-2013-7018243.
U.S. Office Action for U.S. Appl. No. 12/910,664, mailed Feb. 26, 2014.
U.S. Office Action for U.S. Appl. No. 12/966,514, mailed Feb. 25, 2014.
U.S. Office Action for U.S. Appl. No. 14/021,672 mailed May 9, 2014.
U.S. Office Action for U.S. Appl. No. 12/945,492 mailed May 13, 2014.
U.S. Office Action for U.S. Appl. No. 12/982,269 mailed Jun. 11, 2014.
U.S. Office Action for U.S. Appl. No. 13/556,041 mailed Jun. 12, 2014.
U.S. Office Action for U.S. Appl. No. 13/106,851 mailed May 29, 2014.
Kosonocky, et al., 160×244 Element PtSi Schottky-Barrier IR-CCD Image Sensor, IEEE Transactions on Electron Devices, vol. Ed-32, No. 8, Aug. 1985.
Office Action for U.S. Appl. No. 14/450,812 mailed Jul. 23, 2015.
Office Action for U.S. Appl. No. 14/293,164 mailed Aug. 14, 2015.
Office Action for U.S. Appl. No. 12/966,514 mailed Nov. 2, 2015.
Office Action for U.S. Appl. No. 12/633,313 mailed Oct. 21, 2015.
Office Action for U.S. Appl. No. 13/963,847 mailed Sep. 1, 2015.
Office Action for U.S. Appl. No. 12/945,492 mailed Sep. 9, 2015.
Office Action for U.S. Appl. No. 14/459,398 mailed Sep. 16, 2015.
Office Action for U.S. Appl. No. 14/274,448 mailed Aug. 26, 2015.
Office Action for U.S. Appl. No. 13/288,131 mailed Oct. 22, 2015.
Office Action for U.S. Appl. No. 12/945,429 mailed Sep. 4, 2015.
U.S. Office Action for U.S. Appl. No. 12/633,313 mailed Aug. 1, 2014.
Office Action issued on Jun. 19, 2014 in Taiwanese Application No. 099133891.
U.S. Office Action for U.S. Appl. No. 12/966,514 mailed Sep. 23, 2014.
Office Action issued on Jun. 24, 2014 in Taiwanese Application No. 098129911.
University of California San Diego, Class ECE 183 Lab 1, 2013.
U.S. Office Action for U.S. Appl. No. 13/693,207 mailed Oct. 9, 2014.
Office Action issued on Oct. 29, 2014 in Korean Application No. 10-2013-7020107.
U.S. Office Action for U.S. Appl. No. 13/925,429 mailed Nov. 4, 2014.
Corrected Notice of Allowability issued on Oct. 14, 2014 in U.S. Appl. No. 12/966,535.
U.S. Office Action for U.S. Appl. No. 13/543,307 mailed Dec. 24, 2014.
U.S. Office Action for U.S. Appl. No. 14/274,448 mailed Dec. 5, 2014.
International Search Report and Written Opinion for International Application No. PCT/US2014/056558 mailed Dec. 12, 2014.
Office Action issued on Nov. 11, 2014 in Taiwanese Application No. 098129911.
International Search Report and Written Opinion for International Application No. PCT/US2014/050544 mailed Jan. 9, 2015.
Notice of Allowance issued on Dec. 1, 2014 in U.S. Appl. No. 12/910,664.
Office Action for U.S. Appl. No. 13/963,847 mailed Mar. 12, 2015.
Office Action issued on Mar. 3, 2014 in Chinese Application No. 200980142671.9.
Notice of Allowance issued Jan. 30, 2015 in U.S. Appl. No. 14/487,375.
Office Action for U.S. Appl. No. 12/982,269, mailed Jan. 15, 2015.
Office Action for U.S. Appl. No. 12,945,492 mailed Jan. 16, 2015.
Office Action for U.S. Appl. No. 12/966,514 mailed Mar. 10, 2015.
Office Action issued on Jan. 16, 2015 in Chinese Application No. 201180054442.9.
Office Action issued Feb. 23, 2015 in U.S. Appl. No. 13/925,429.
Office Action issued on Mar. 4, 2015 in U.S. Appl. No. 13/556,041.
Bernstein et al. "Modern Physics", Chapter 14, Section 6, pp. 420-421, 2000 by Prentice-Hall Inc.
Office Action for U.S. Appl. No. 13/693207 mailed May 7, 2015.
Kim, Y.S. et al., "ITO/AU/ITO multilayer thin films for transparent conducting electrode applications", Applied Surface Science, vol. 254 (2007), pp. 1524-1527.
Philipp, H.R. et al., "Optical Constants of Silicon in the Region 1 to 10 ev", Physical Review, vol. 120, No. 1, pp. 37-38, Oct. 1, 1960.
Office Action for U.S. Appl. No. 13/543,307 mailed Apr. 17, 2015.
Office Action issued Mar. 19, 2015 in Chinese Application No. 201180065814.8.
Office Action for U.S. Appl. No. 13/288,131 mailed Apr. 17, 2015.
Office Action for U.S. Appl. No. 14/281,108 mailed Apr. 6, 2015.
Office Action for U.S. Appl. No. 14/450,812 mailed Apr. 1, 2015.
Office Action for U.S. Appl. No. 12/633,313 mailed Apr. 9, 2015.
Office Action issued on Mar. 18, 2015 in Chinese Application No. 201180066970.6.
Office Action issued Apr. 3, 2015 in Chinese Application No. 201180051048.X.
Office Action issued May 15, 2015 in U.S. Appl. No. 14/274,448.
Office Action for U.S. Appl. No. 12/982,269 mailed May 22, 2015.
Office Action issued May 22, 2015 in Taiwanese Application No. 099142971.
Office Action mailed May 26, 2015 in Japanese Application No. 2014 138265.
Office Action for U.S. Appl. No. 14/068,864 mailed Jun. 15, 2015.
Office Action issued on May 5, 2015 in Chinese Application No. 201410264248.9.
Office Action issued Aug. 12, 2015 in Chinese Application No. 201180054442.9.
Office Action mailed Sep. 30, 2015 in Japanese Application No. 2014-094365.
Office Action dated Oct. 6, 2015 in Taiwanese Application No. 100141376.
Office Action dated Sep. 11, 2015 in Taiwanese Application No. 103143553.
International Search Report and Written Opinion mailed Nov. 27, 2015 in International Application No. PCT/US2015/038999.
Office Action issued Jul. 9, 2015 in Taiwanese Application No. 102124069.

(56) References Cited

OTHER PUBLICATIONS

A. Gu et al., "Design and growth of III-V nanowire solar cell arrays on low cost substrates," Conf. Record, 35rd IEEE Photovoltaic Specialists Conference, Honolulu, Jun. 2010, pp. 20-25.
Office Action issued Jun. 23, 2015 in Chinese Application No. 201310284409.6.
Office Action for U.S. Appl. No. 14/450,812 mailed Oct. 28, 2015.
Office Action issued on Nov. 25, 2015 in Japanese Application No. 2015-005091.
Office Action issued Nov. 17, 2015 in Taiwanese Application 103102171.
Office Action issued Nov. 20, 2015 in Taiwanese Application 104108370.
Office Action issued on Nov. 27, 2015 in Taiwanese Application No. 100138526.
International Search Report and Written Opinion mailed Jan. 8, 2016 in International Application No. PCT/US2015/055728.
Office Action issued Feb. 25, 2016 in Chinese Application No. 201180051048.X.
Office Action issued Feb. 1, 2016 in Taiwanese Application 102124069.
Office Action issued Feb. 6, 2016 in Chinese Application No. 201180054442.9.
Office Action issued Feb. 4, 2016 in U.S. Appl. No. 14/274,448.
Office Action issued Mar. 7, 2016 in U.S. Appl. No. 14/450,812.
Office Action issued Dec. 28, 2015 in Taiwanese Application No. 102149110.
Office Action issued Dec. 25, 2015 in Chinese Application No. 201410264248.9.
Office Action issued Dec. 30, 2015 in Taiwanese Application No. 104123757.
International Search Report and Written Opinion mailed Nov. 27, 2015 in International Application PCT/US2015/038999.
Office Action issued Jan. 15, 2016 in Chinese Application No. 201180066970.6.
International Preliminary Report on Patentability issued Feb. 9, 2016 in International Application PCT/US2014/050544.
International Search Report and Written Opinion mailed Feb. 9, 2016 in International Application PCT/US2015/55710.
Office Action issued Jan. 5, 2016 in U.S. Appl. No. 14/291,888.
Office Action issued Nov. 9, 2015 in U.S. Appl. No. 14/503,598.
Office Action issued Jan. 15, 2016 in U.S. Appl. No. 14/632,739.
Office Action issued Jan. 4, 2016 in U.S. Appl. No. 14/293,164.
Office Action issued Jan. 7, 2016 in U.S. Appl. No. 14/322,503.
Office Action issued Jan. 14, 2016 in U.S. Appl. No. 14/459,398.
Office Action mailed Mar. 29, 2016 in Japanese Application No. 2014-138265.
International Preliminary Report on Patentability issued on Mar. 22, 2016 in International Application PCT/US2014/056558.
Decision issued on Jan. 30, 2016 in Taiwanese Application 099142971.
Office Action issued Apr. 6, 2016 in Taiwanese Application 100149997.
Decision issued Mar. 28, 2016 in Taiwanese Application 103143553.
Office Action issued Apr. 27, 2016 in Chinese Application 201410265340.7.
Office Action issued Apr. 29, 2016 in Chinese Application 201301284409.6.
Office Action issued Jul. 6, 2016 in U.S. Appl. No. 14/334,848.
Notice of Allowance issued Jun. 22, 2016 in U.S. Appl. No. 14/293,164.
Office Action issued Jun. 3, 2016 in U.S. Appl. No. 14/459,398.
Office Action issued Jun. 1, 2016 in U.S. Appl. No. 13/693,207.
Notice of Allowance issued Jul. 25, 2016 in U.S. Appl. No. 12/945,492.
Office Action issued May 16, 2016 in U.S. Appl. No. 12/633,313.
Office Action issued Jun. 29, 2016 in Chinese Application 201280030352.0.
Office Action issued Jun. 16, 2016 in Taiwanese Application 100138526.
Office Action issued Jun. 17, 2016 in Chinese Application 201410264248.9.

* cited by examiner

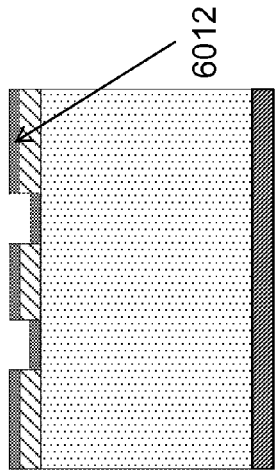
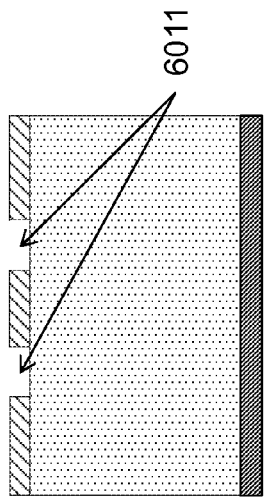
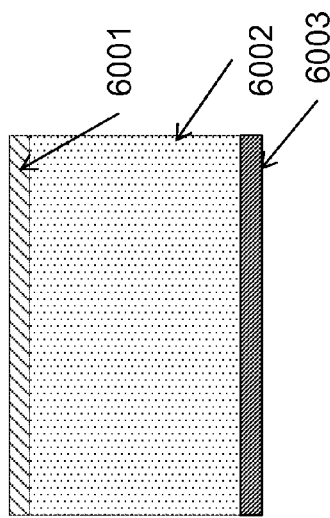
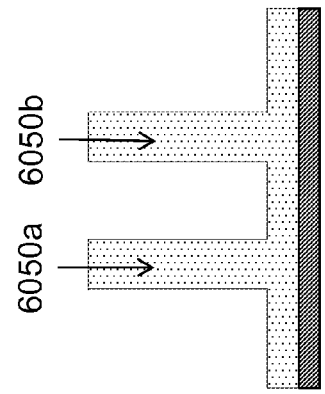
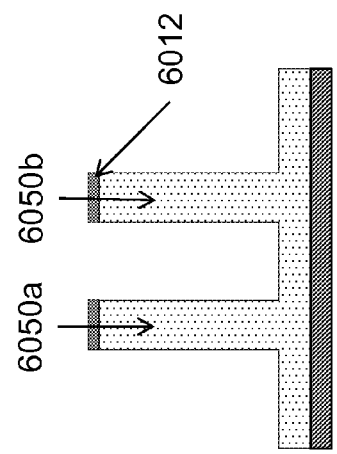
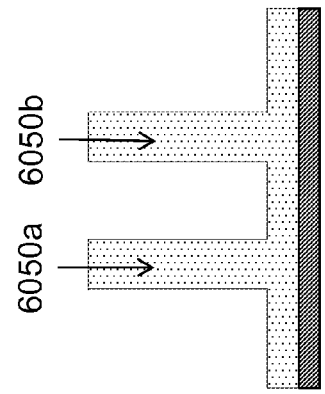

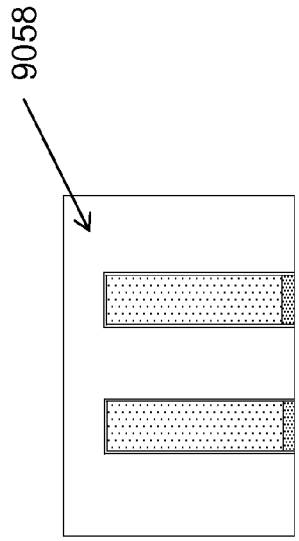
Figure 9C
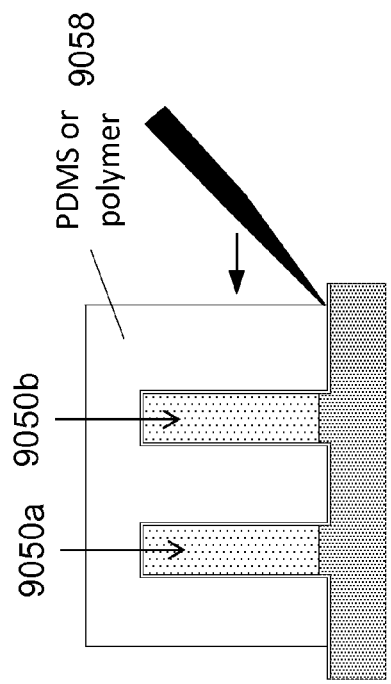
Figure 9B
Figure 9D
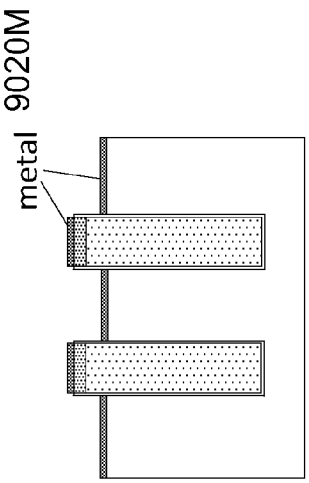
Figure 9E

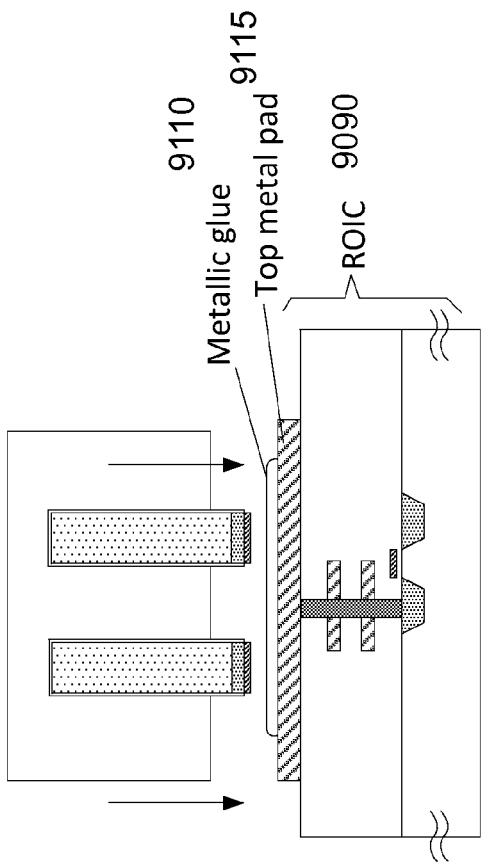
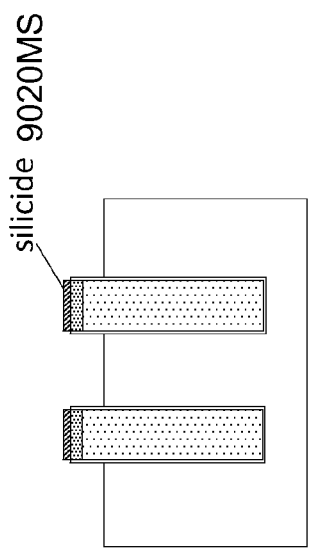
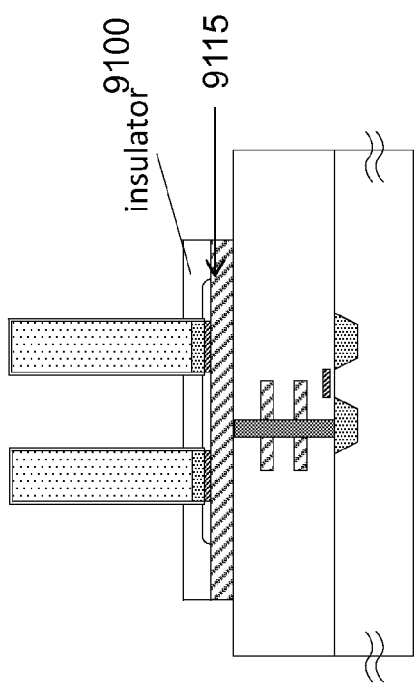
Figure 9F
Figure 9G
Figure 9H

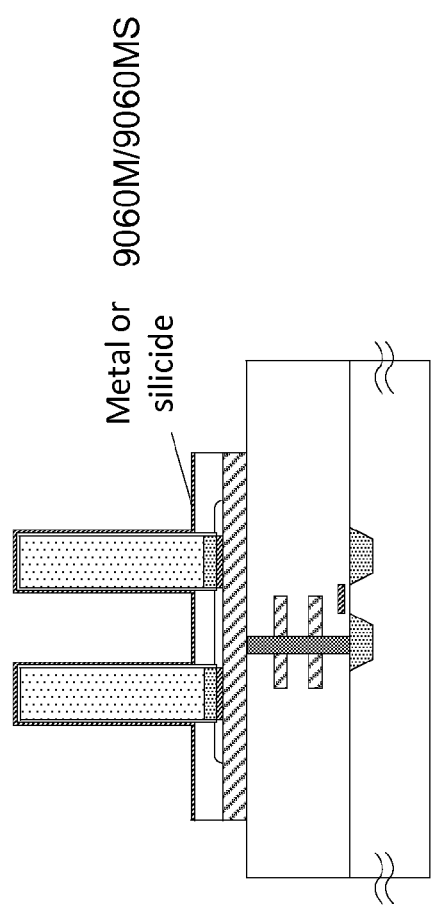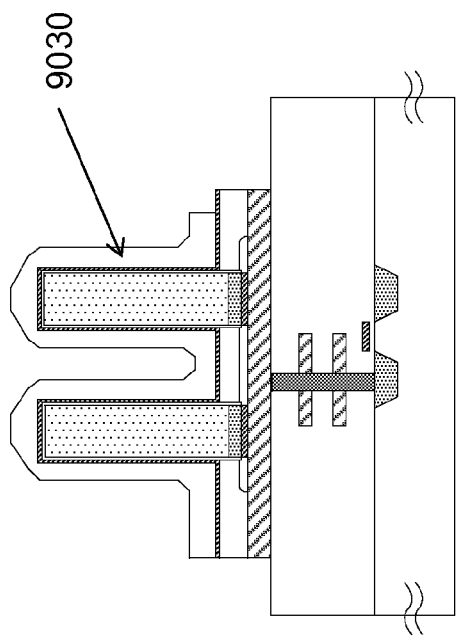
Figure 9I
Figure 9J

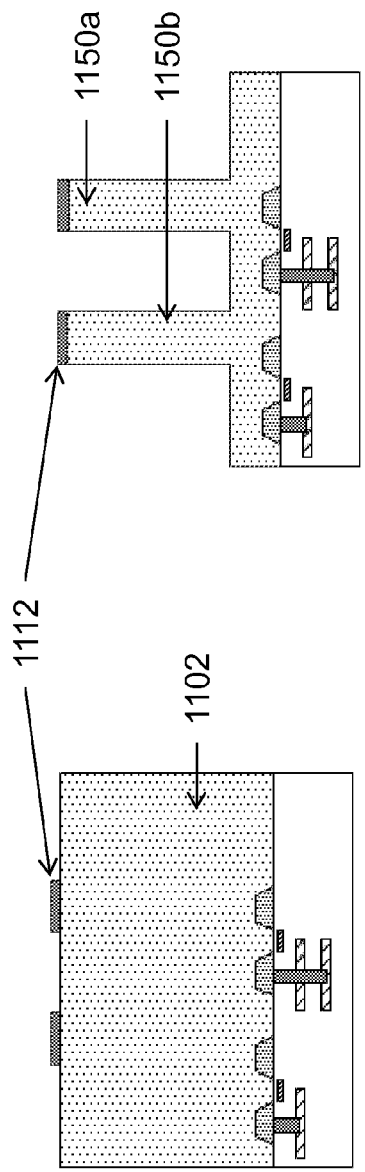
Figure 11E
Figure 11F
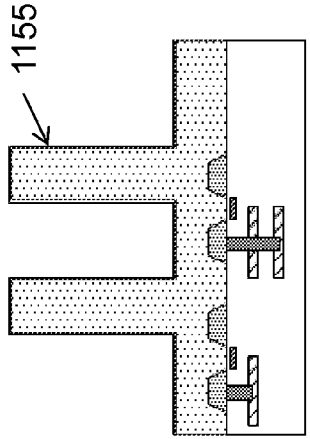
Figure 11G
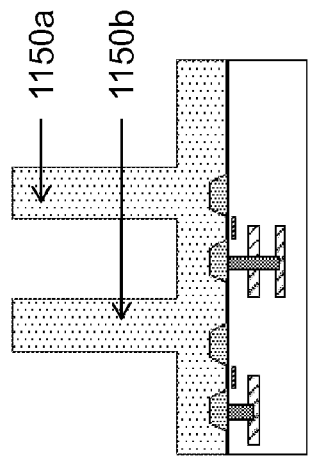
Figure 11H

VERTICAL PILLAR STRUCTURED INFRARED DETECTOR AND FABRICATION METHOD FOR THE SAME

RELATED APPLICATIONS

The disclosures of U.S. patent application Ser. Nos. 12/621,497, 12/633,297, 61/266064, 12/982269, 12/966573, 12/967880, 61/357429, 12/974499, 61/360421, 12/910664, 12/945492, 12/966514, 12/966535, 13/047392, 13/048635, 13/106851, 61/488535, 13/288131, 13/494661, and 13/693207, are each hereby incorporated by reference in their entirety.

FIELD OF INVENTION

The present disclosure is related to optical sensors, particularly to sensors for detecting infrared light.

BACKGROUND

Schottky barrier diodes have long been used as infrared detectors because their low energy barrier height property was suitable for IR detection. In addition, because of their fabrication process compatibility to the existing CMOS process, it is possible to integrate other readout circuitry with the multiple detector elements arranged in a pixel array. Unlike other p-n junction photodiodes where most of photo-generation of carriers induced by light absorption takes place in the bulk substrate, the photo-generation of carriers in Schottky barrier diodes takes place on the metal surface governed by the thermionic emission. If carriers in the metal get enough thermal energy induced by light absorption they can emit from the metal surface by overcoming the binding energy which is called the work function of the metal. If the potential barrier of the metal-semiconductor junction is lower than the energy that the emitted carrier has, an electric current flows across the SB junction.

The quantum efficiency of these Schottky barrier diodes is inherently very low due to their thermionic emission nature. This is because incident light passes through only once and only a portion of the light is absorbed by the thin metal layer. Accordingly, infrared sensors having higher quantum efficiency are required.

SUMMARY

In an embodiment according to the present disclosure, a photodetector device is described. The device includes a substrate and one or more core structures, each having one or more shell layers disposed at least on a portion of a sidewall of the core structure. Each of the one or more structures extends substantially perpendicularly from the substrate. Each of the one or more core structures and the one or more shell layers form a Schottky barrier junction or a metal-insulator-semiconductor (MiS) junction.

In an embodiment according to the present disclosure, a photodetector device includes a substrate and one or more structures, each extending substantially perpendicularly from the substrate. Each of the one or more structures has a core-shell junction along at least a portion of a sidewall of the structure. The core-shell junction is configured to generate an electrical signal upon exposure to incident electromagnetic radiation.

In an embodiment according to the present disclosure, an imaging device include a substrate, an array of core structures, each of the core structures having one or more shell layers disposed at least on a portion of a sidewall of each of the core structures. Each of the core structures extends substantially perpendicularly from the substrate. Each of the core structures and the one or more shell layers form a core-shell junction are configured to generate an electrical signal upon exposure to incident electromagnetic radiation. The imaging device further includes a pixel array, and an electronic circuit, in electrical communication with the pixel array, configured to process the electrical signal. Each of the pixels comprises the array of core structures.

In an embodiment according to the present disclosure, a method for making a photodetector device includes making one or more core structures such that each of the one or more structures extends substantially perpendicularly from a substrate, disposing a metallic material to substantially encapsulate an extending portion of each of the one or more core structures, providing thermal energy to the one or more core structures such that the metallic material interacts with a material of the one or more core structures to form an alloy or a compound layer on each of the one or more core structures.

In an embodiment according to the present disclosure, a method of detecting electromagnetic radiation includes obtaining a device comprising a substrate, and one or more structures, each extending substantially perpendicularly from the substrate. Each of the one or more structures has a core-shell junction along at least a portion of a sidewall of the structure. The core-shell junction is configured to generate an electrical signal upon exposure to incident electromagnetic radiation. The method further includes exposing the device to electromagnetic radiation, and processing the electrical signal.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention. As used in this document, the term "comprising" means "including, but not limited to."

This disclosure is not limited to the particular systems, devices and methods described, as these may vary. The terminology used in the description is for the purpose of describing the particular versions or embodiments only, and is not intended to limit the scope.

BRIEF DESCRIPTION OF THE DRAWINGS

In the present disclosure, reference is made to the accompanying drawings, which form a part hereof. In the drawings, similar symbols typically identify similar components, unless context dictates otherwise. Various embodiments described in the detailed description, drawings, and claims are illustrative and not meant to be limiting. Other embodiments may be used, and other changes may be made, without departing from the spirit or scope of the subject matter presented herein. It will be understood that the aspects of the present disclosure, as generally described herein, and illustrated in the Figures, can be arranged, substituted, combined, separated, and designed in a wide variety of different configurations, all of which are contemplated herein.

FIGS. 6A-6J schematically illustrate various steps during the fabrication of the pillar-structured IR detector illustrated in FIG. 5.

FIGS. 9A-9J schematically illustrate various steps during the fabrication of a pillar-structured IR detector on an ROIC chip.

FIGS. 11A-11J schematically illustrate various steps during the fabrication of a pillar-structured IR detector on the backside of an ROIC chip.

DETAILED DESCRIPTION

Figure 1B:
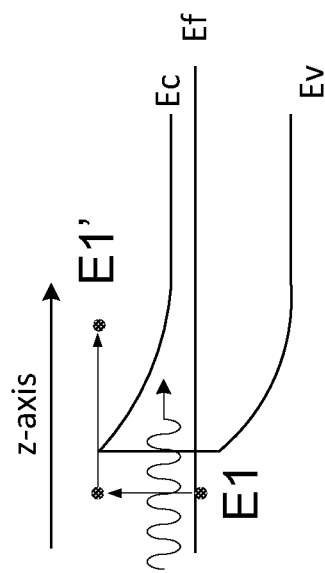
FIG. 1B illustrates the energy band diagram of the planar Schottky barrier junction illustrated in FIG. 1A.
Figure 1A:
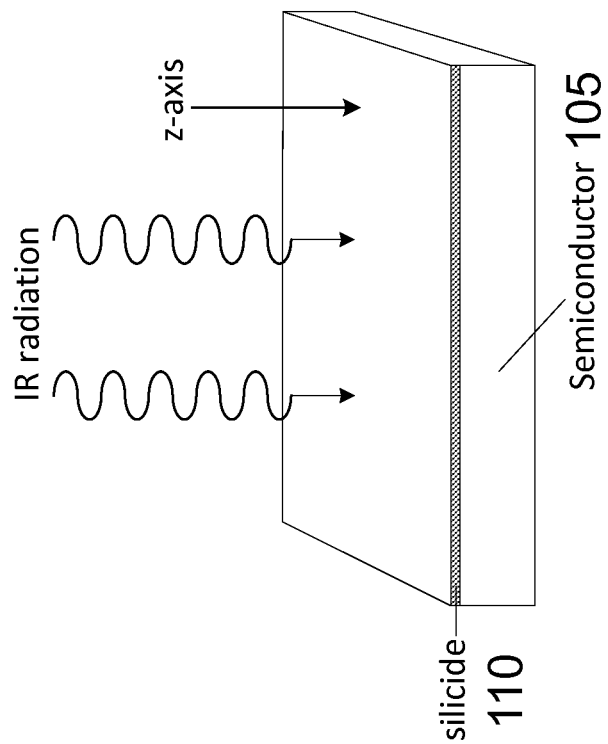
FIG. 1A depicts an illustrative example of a planar Schottky barrier junction device.

FIG. 1A illustrates an embodiment of a planar Schottky barrier junction device. The device includes a semiconductor substrate 105 and a metallic layer 110 that forms a Schottky barrier junction with semiconductor substrate 105. When charge carriers in the metallic layer (typically, electrons), get thermal energy sufficient to overcome their work function, the charge carriers are emitted from metallic layer 110 into the semiconductor substrate 105. If the potential barrier of the metal-semiconductor junction is lower than the energy of the charge carrier, an electric current is generated across the Schottky barrier junction. In the embodiment illustrated in FIG. 1A, thermal energy is provided by infrared (IR) radiation. The term "metallic" as used herein, refers to any material having substantially no band gap between their valence band and conduction band. Examples of metallic materials include, but are not limited to, metals such as aluminum (Al), nickel (Ni), gold (Au), silver (Ag), copper (Cu), titanium (Ti), palladium (Pd), platinum (Pt), iridium (Ir), cobalt (Co), tungsten (W), chromium (Cr), beryllium (Be), and the like, and/or any combinations thereof; metal-semiconductor alloys such as metal silicides; and the like and/or any combinations thereof.

FIG. 1B illustrates the energy band diagram of the planar Schottky barrier junction illustrated in FIG. 1A. As the IR radiation provides energy to an electron E1. Since the energy of this electron is higher than the work function $E_f$ of metallic layer 110, the electron is emitted from metallic layer 110 and becomes a free electron E1'. If the energy of potential barrier of the Schottky barrier junction is $E_c-E_v$ is lower than the energy of the electron E1', the electron passes into semiconductor substrate 105, thereby generating an electric current across the Schottky barrier junction.

In a planar device, such as the one illustrated in FIG. 1A, the incident radiation passes through the junction only once. Since not all photons impinging on the silicide surface generate thermionic electrons, such devices have inherently low quantum efficiency.

Without wishing to be bound by theory, it is contemplated that a photodetector device having an array of core-shell Schottky barrier junctions which are perpendicular to a substrate (interchangeably referred to herein as "vertical Schottky junctions") and in parallel with the direction of light propagation results in a significant increase in the effective absorption area, thereby improving the quantum efficiency of the photodetector device.

Figure 2B:
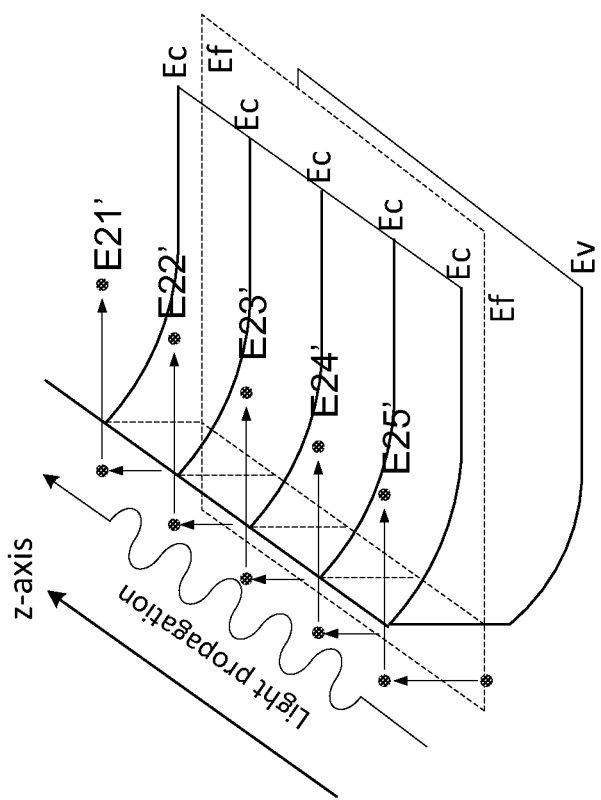
FIG. 2B illustrates the energy band diagram of the vertical Schottky junction illustrated in FIG. 2B.
Figure 2A:
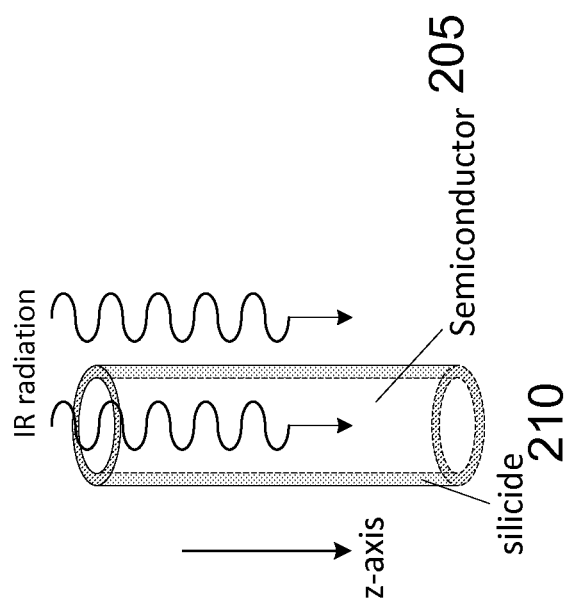
FIG. 2A illustrates an embodiment of an individual vertical Schottky junction.

FIG. 2 illustrates an embodiment of an individual vertical Schottky junction. The vertical Schottky junction includes a "pillar" shaped semiconductor core 205 and a silicide layer forming a shell 210 around the outer wall of semiconductor core 205. As the incident IR radiation passes through semiconductor core 205, multiple thermionic electrons can be generated, thereby improving the quantum efficiency. This is further illustrated in the energy band diagram in FIG. 2B. As IR radiation passes through the vertical Schottky junction, free electrons E21', E22', E23', E24' and E25' are emitted from silicide core 210, and pass through semiconductor core 205 to generate an electric current across the vertical Schottky junction.

It is also contemplated that light can couple into guided mode in individual vertical Schottky junctions depending on their diameter and material. By choosing a suitable material and an appropriate distribution of diameters across the array, it is contemplated that a photodetector array can result in significantly improved efficiency in quantum efficiency.

Described herein are photodetector devices and methods of making photodetector arrays. A photodetector device may include a substrate comprising a semiconductor material and one or more core structures. Each of the one or more core structures has one or more shell layers disposed thereon and extends substantially perpendicularly from the substrate. At least one of the one or more shell layers includes a metallic material. Each of the one or more core structures and the one or more shell layers form a Schottky barrier junction or a metal-insulator-semiconductor (MIS) junction. The one or more core structures may comprise essentially the same material composition as the substrate.

Figure 3:
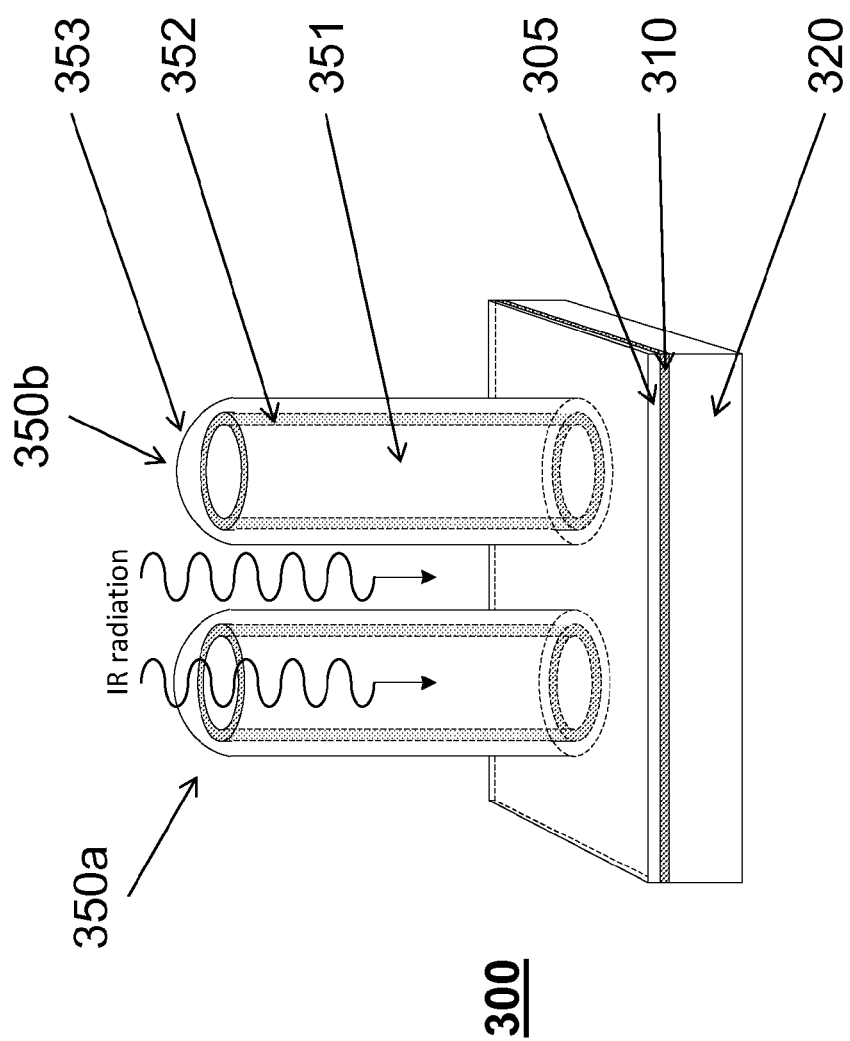
FIG. 3 illustrates an embodiment of a photodetector device having an array of vertical Schottky junctions, according to various aspects of the present disclosure.

FIG. 3 illustrates an embodiment of a photodetector device 300 having an array of vertical Schottky junctions, according to various aspects of the present disclosure. The photodetector of such an embodiment includes a semiconductor substrate 305, a metallic layer 310 for electrical connectivity, a mounting substrate 320, and vertical Schottky junctions 350a and 350b. Vertical Schottky junctions 350a and 350b each include a semiconductor core 351, and a conducting shell layer 352.

Metallic layer 310 may be composed of any suitable metal compatible with the manufacturing process used for making photodetector device 300. For example, it is well known that aluminum (Al) provides good electrical contacts in microelectronic circuits and is compatible with most fabrication processes. On the other hand, gold (Au) or copper (Cu) may diffuse into a semiconductor substrate if the fabrication process includes a heating step, particularly if the temperature is raised above about 120° C. Gold or copper, in such instances, may not be the best choice for metallic layer 310. Suitable metals include, but are not limited to, aluminum (Al), nickel (Ni), gold (Au), silver (Ag), copper (Cu), titanium (Ti), palladium (Pd), platinum (Pt), and the like, and/or any combinations thereof.

Mounting substrate 320, in some embodiments, may include electronic circuits to detect and process the electrical signal generated by photodetector device 300.

In various embodiments, semiconductor substrate 305 may be composed of group IV semiconductors such as, for example, silicon (Si) or Germanium (Ge); group III-V semiconductors such as, for example, gallium arsenide (GaAs), aluminum arsenide (AlAs), indium phosphide (InP), and/or the like; group II-VI semiconductors such as, for example, cadmium sulfide (CdS), cadmium telluride (CdTe), zinc oxide (ZnO), and/or the like; quaternary semiconductors such as, for example, aluminum gallium arsenide (AlGaAs), indium gallium phosphide (InGaP), aluminum indium phosphide (AlInP), and/or the like; and/or any combination thereof. Semiconductor substrate 305 may be single crystalline, polycrystalline or amorphous in various embodiments. It is contemplated that semiconductor substrate 305 may be intrinsic (undoped), p-type lightly doped, p-type heavily doped, n-type lightly doped or n-type heavily doped semiconductor.

Semiconductor core 351, in various embodiments, may be composed of substantially the same material as semiconductor substrate 305. It is contemplated that semiconductor core 351 may be more heavily doped, less heavily doped, or differently doped than semiconductor substrate 305. For example, in an embodiment, semiconductor substrate 305 and semiconductor core 351 may be both intrinsic single crystal silicon. In some embodiments, semiconductor substrate 305 and semiconductor core 351 are portions of a single crystal such that there is substantially no grain boundary between semiconductor substrate 305 and semiconductor core 351.

Conducting shell layer 352, in various embodiments, may be composed of a metallic material such as a metal or a metal-semiconductor alloy such as, for example, a metal silicide. Without wishing to be bound by theory, it is contemplated that a Schottky barrier junction formed between a semiconductor and a metal-semiconductor alloy may have a lower potential barrier than a Schottky barrier junction formed between a metal and a semiconductor. Semiconductor-alloy Schottky barrier junctions may, therefore, generate higher currents than semiconductor-metal Schottky barrier junctions for radiation of the same wavelength. Thus, it may be advantageous, in some embodiments, to use a metal-semiconductor alloy for conducting shell layer 352.

In some embodiments, conducting shell layer 352 may be composed of a metal such as, for example, platinum (Pt), titanium (Ti), palladium (Pd), iridium (Ir), nickel (Ni), cobalt (Co), tungsten (W), chromium (Cr), beryllium (Be), and the like, and/or any combinations thereof. In some embodiments, semiconductor substrate 305 and semiconductor core 351 may be composed of silicon. In such embodiments, conducting shell layer 352 may be composed of a metal-semiconductor alloy (e.g., metal silicide) such as, for example, PtSi, $Pt_2Si$, PdSi, $Pd_2Si$, NiSi, $Ni_2Si$, $CoSi_2$, IrSi, $IrSi_3$, $WSi_2$, CrSi, $CrSi_2$, TiSi, $TiSi_2$, BeSi, $Be_2Si$, and the like, and/or any combination thereof.

Vertical Schottky junctions 350a and 350b may, in some embodiments, additionally include optical clad layer 353 that substantially encapsulates conducting shell layer 352. Optical clad layer 353 in such embodiments may improve the efficiency of photodetector device 300 by creating an optical waveguide effect and preventing the radiation coupled to vertical Schottky junctions 350a and 350b from scattering out. Suitable materials for optical clad layer 353 include transparent polymers having a refractive index lower than that of the individual vertical Schottky junction, such as, for example, polydimethyl siloxane (PDMS), polymethyl methacrylate (PMMA), polyethylene terephthalate (PET), and the like, and/or any combinations thereof. Other suitable materials include, but are not limited to, $Al_2O_3$, $HfO_2$, $SiO_2$, $MgF_2$, SnO, doped SnO, ZnO, doped ZnO, and the like, and/or any combinations thereof.

As discussed elsewhere herein, it may be advantageous in some embodiments to have a lower potential barrier for the Schottky barrier junction. A low potential barrier, however, may cause the photodetector device to be sensitive to low levels of radiation resulting in a low signal-to-noise ratio (SNR). Thus, for some applications of the photodetector device, a low potential barrier may be undesirable. Without wishing to be bound by theory, it is contemplated that the potential barrier for a Schottky barrier junction may be increased by introducing a thin dielectric layer between the semiconductor core and the conducting shell layer to form a core-shell metal-insulator-semiconductor (MiS) junction. Such a thin dielectric layer may reduce the "dark current" or noise from the individual vertical Schottky junctions' output.

Figure 4:
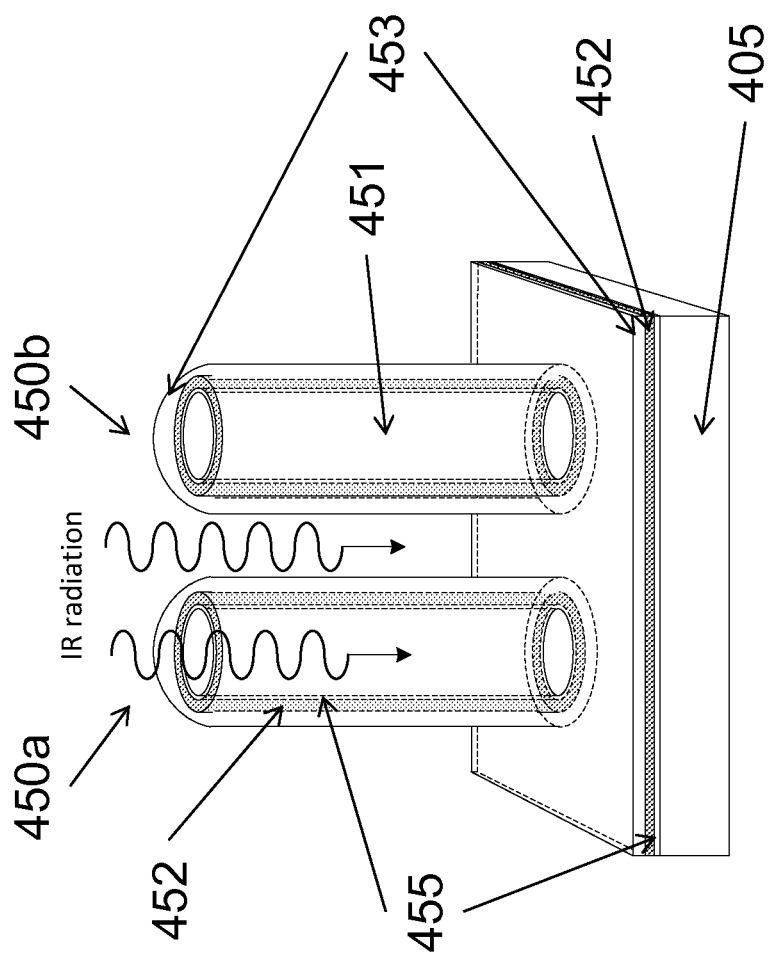
FIG. 4 illustrates an embodiment of a photodetector device having an array of vertical MiS junctions, according to various aspects of the present disclosure.

FIG. 4 illustrates an embodiment of a photodetector device 400 having an array of vertical MiS junctions, according to various aspects of the present disclosure. The photodetector of such an embodiment includes a semiconductor substrate 405, a metallic layer (not explicitly shown) for electrical connectivity, a mounting substrate (not explicitly shown), and vertical MiS junctions 450a and 450b. Vertical MiS junctions 450a and 450b each include a semiconductor core 451, an insulating layer 455, and a conducting shell layer 452.

Metallic layer 410 may be composed of any suitable metal compatible with the manufacturing process used for making photodetector device 400. Examples of suitable metals are provided elsewhere herein. As discussed elsewhere herein, mounting substrate 420, in some embodiments, may include electronic circuits to detect and process the electrical signal generated by photodetector device 400.

In various embodiments, semiconductor substrate 405 may be composed of group IV semiconductors such as, for example, silicon (Si) or Germanium (Ge); group III-V semiconductors such as, for example, gallium arsenide (GaAs), aluminum arsenide (AlAs), indium phosphide (InP), and/or the like; group II-VI semiconductors such as, for example, cadmium sulfide (CdS), cadmium telluride (CdTe), zinc oxide (ZnO), and/or the like; quaternary semiconductors such as, for example, aluminum gallium arsenide (AlGaAs), indium gallium phosphide (InGaP), aluminum indium phosphide (AlInP), and/or the like; and/or any combination thereof. Semiconductor substrate 405 may be single crystalline, polycrystalline or amorphous in various embodiments. It is contemplated that semiconductor substrate 405 may be intrinsic (undoped), p-type lightly doped, p-type heavily doped, n-type lightly doped or n-type heavily doped semiconductor.

Semiconductor core 451, in various embodiments, may be composed of substantially the same material as semiconductor substrate 405. It is contemplated that semiconductor core 451 may be more heavily doped, less heavily doped, or differently doped than semiconductor substrate 405. For example, in an embodiment, semiconductor substrate 405 and semiconductor core 451 may be both intrinsic single crystal silicon. In some embodiments, semiconductor substrate 405 and semiconductor core 451 are portions of a single crystal such that there is substantially no grain boundary between semiconductor substrate 405 and semiconductor core 451.

As in case of photodetector 300, conducting shell layer 452 of photodetector device 400 may be composed of any suitable metal, conducting alloy, or metal-semiconductor alloy. Examples of suitable metals include, but are not limited to, platinum (Pt), titanium (Ti), palladium (Pd), iridium (Ir), nickel (Ni), cobalt (Co), tungsten (W), chromium (Cr), beryllium (Be), and the like, and/or any combinations thereof. Examples of metal-semiconductor alloy include, but are not limited to, PtSi, $Pt_2Si$, PdSi, $Pd_2Si$, NiSi, $Ni_2Si$, $CoSi_2$, IrSi, $IrSi_3$, $WSi_2$, CrSi, $CrSi_2$, TiSi, $TiSi_2$, BeSi, $Be_2Si$, and the like, and/or any combination thereof.

As discussed elsewhere herein, including insulating layer 455 may advantageously reduce noise by increasing the potential barrier between the semiconductor core and the conducting shell layer. Any suitable insulating material may be used for providing insulating layer 455. It will be understood by one of ordinary skill in the art that factors such as compatibility with fabrication process and other materials used in fabricating the device determine the suitability of the insulating material. For example, if the semiconductor core is silicon, the insulating layer can be silicon dioxide ($SiO_2$) or silicon nitride ($Si_3N_4$). Other examples of materials suitable for insulating layer 451 include, but are not limited to, oxides such as $Al_2O_3$, $HfO_2$, $MgF_2$, $SnO_2$, ZnO, and the like; various transparent polymers such as PDMS, PMMA, PET, and the like; and/or any combinations thereof. It is desirable that insulating layer 455 be transparent, at least to IR radiation. Thickness of insulating layer 455 is determined by various factors such as, for example, material used for the layer, wavelength or range of wavelengths that are to be detected by photodetector device 400, materials used for semiconductor core 451 and/or conducting shell layer 452, and the like.

As in case of photodetector 300, the vertical MiS junctions 450a and 450b of photodetector 400, may, in some embodiments, additionally include optical clad layer 453 that substantially encapsulates conducting shell layer 452. Suitable materials for optical clad layer 453 include transparent polymers having a refractive index lower than that of the individual vertical MiS junction, such as, for example, polydimethyl siloxane (PDMS), polymethyl methacrylate (PMMA), polyethylene terephthalate (PET), and the like, and/or any combinations thereof. Other suitable materials include, but are not limited to, $Al_2O_3$, $HfO_2$, $SiO_2$, $MgF_2$, SnO, doped SnO, ZnO, doped ZnO, and the like, and/or any combinations thereof.

In general, the semiconductor core of the photodetector device may have any shape or size. For example, a cross-section of the semiconductor core may have a shape of a circle, an ellipse, a convex polygon, a mesh, and the like, or any combination thereof. Likewise, the semiconductor core may be shaped as a cylinder, a frustum, a cone, a prism, and the like, and/or any combination thereof.

Because the probability of carrier generation increases, the longer the radiation propagates through the semiconductor core, it may be advantageous to provide the semiconductor cores an aspect ratio greater than one. Aspect ratio is typically defined as the ratio of a dimension perpendicular to the substrate to a dimension parallel to the substrate. In case of the photodetector devices described herein, the aspect ratio may be defined as the ratio of height to diameter of the semiconductor core structures. As aspect ratio greater than one, thus, may result in increasing the quantum efficiency of the photodetector device by enhancing the optical waveguide effect of the core structures. Another approach to enhancing the optical waveguide effect may be to provide rounded or tapered ends to the semiconductor core structures. Such structure may be advantageous by reflecting the back-scattered light back into the core structure and further improving the quantum efficiency of the photodetector device.

Embodiments illustrating the methods and materials used may be further understood by reference to the following non-limiting examples:

EXAMPLES

Example 1

A Pillar-Structured IR Detector Having a Schottky Barrier Junction

Figure 5:
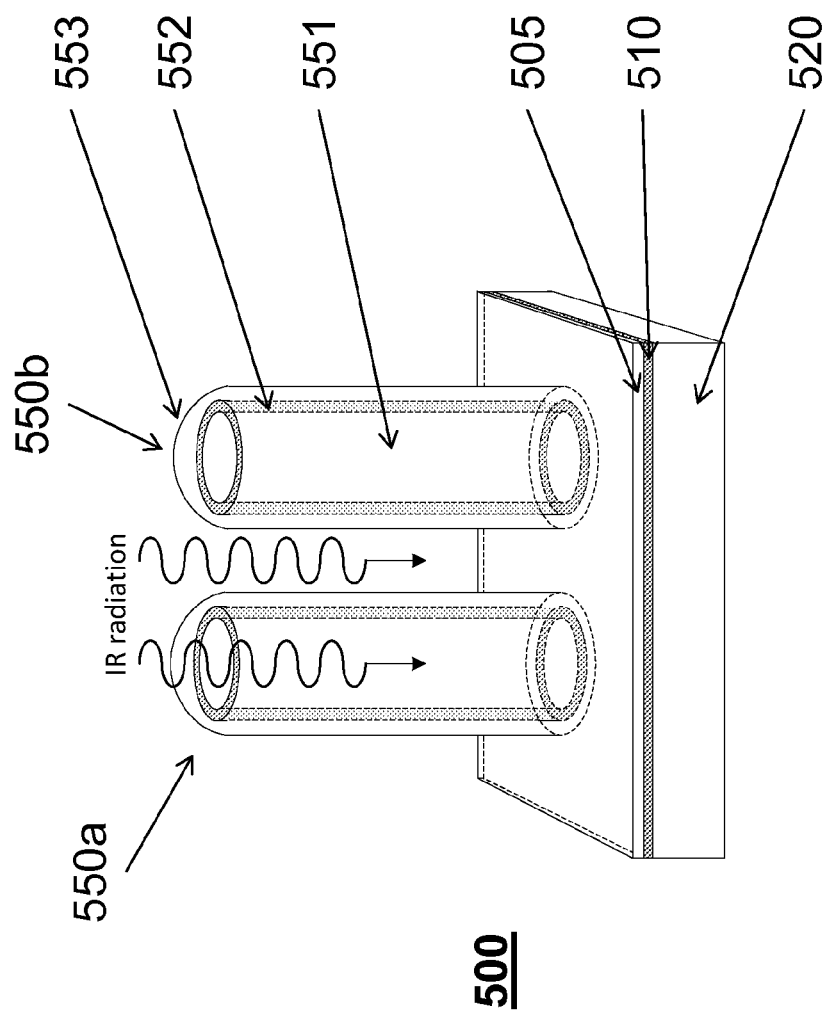
FIG. 5 illustrates an example of a pillar-structured IR detector, having an array of vertical Schottky junctions, in accordance with various aspects of the present disclosure.

FIG. 5 illustrates a pillar-structured IR detector 500, having an array of vertical Schottky junctions. The IR detector illustrated in FIG. 5 includes a silicon substrate 505 having a thickness of about 1 µm to about 50 µm, a metallic layer 510 for electrical connectivity having a thickness of about 50 nm to about 20 µm, a mounting substrate 520 having CMOS read-out circuitry (not explicitly shown) embedded therein, and vertical Schottky junctions 550a and 550b. Vertical Schottky junctions 550a and 550b each include a silicon core 551 having a diameter of about 0.1 µm to about 10 µm, and a metal silicide shell layer 552 having a thickness of about 2 nm to about 50 nm. IR detector 500 further includes a transparent (e.g., $SiO_2$) clad layer 553 having a thickness of about 50 nm to about 600 nm.

One of ordinary skill in the art will understand that the ranges for various dimensions and metals for the various metallic layers provided in this example are merely representative and not limiting. One of ordinary skill in the art will also understand that the dimensions may vary within that range for a same device or between different devices. For example, in a particular detector, the diameter of various core structures may vary within the range. Likewise, one of ordinary skill in the art will understand that the potential barrier between the metal (and/or metal silicide) and semiconductor determines the wavelength of light detected by the junction. Thus, metal used for a metallic layer may also be varied so as to sense a wide range of wavelengths. For example, a Pt-n-type Si junction has a Schottky barrier potential of about 0.85 eV and thus, detects light of a wavelength of up to about 1.5 µm (visible to near IR), whereas a Pt-p-type Si junction has a Schottky barrier potential of about 0.25 eV and thus, detects light of a wavelength of up to about 5 µm (which is well into far IR). In other words, one of ordinary skill in the art will recognize each pixel may have a different metallic layer so as to sense a wide range of IR wavelengths.

FIG. 6 illustrates the various fabrication steps used for making pillar-structured IR detector 500 illustrated in FIG. 5. FIG. 6A illustrates a photoresist (PR) (illustrated by 6001) deposited by spin coating on the top surface of a crystalline silicon substrate (illustrated by 6002) having a heavily doped bottom region (illustrated by 6003). FIG. 6B illustrates a pattern of openings (illustrated by 6011) through which substrate 6002 is exposed. The pattern of openings is obtained via a lithography step. The openings can be circular, elliptical, or any desired convex polygonal shape.

This is followed by deposition of an etch mask layer (illustrated by 6012 in FIG. 6C) over the remaining portion of the PR as well as on the exposed region of the substrate.

Etch mask layer 6012 can be a metal such as Al, Cr, Au, and the like, and/or a dielectric such as $SiO_2$, $Si_3N_4$, and the like and can be deposited using any suitable process physical evaporation such as, thermal evaporation, electron-beam evaporation, sputtering, and the like, and/or chemical deposition such as chemical vapor deposition (CVD), plasma enhanced chemical vapor deposition (PECVD), and the like.

The remainder of PR is then lifted-off by a suitable solvent (e.g., acetone, or the like) and ashed in a resist asher to leave behind etch-mask layer 6012 directly on substrate 6002 (as illustrated in FIG. 6D) such that a portion of the substrate remains exposed. The exposed portion of the substrate is etched using a suitable dry or wet etch method to a desired depth to form pillar structures 6050a and 6050b (as illustrated in FIG. 6E). These pillar structures form silicon core 551 for vertical Schottky junctions 550a and 550b of IR detector 500. Examples of a dry etch process include, but are not limited to, inductively coupled plasma reactive ion etch (ICP RIE) process, or Bosch process. Examples of wet etch process include, but are not limited to, metal assisted chemical etch (MACE) process. One of ordinary skill in the art will be able to choose a suitable etch process depending on other factors such as the particular materials being used and the desired dimensions of various structures to be fabricated.

FIG. 6F illustrates pillar structures 6050a and 6050b after removal of the etch mask layer. Removal of the etch mask layer can be achieved using any suitable wet or dry etch process depending on the particular material of the etch mask layer.

Figure 6G:
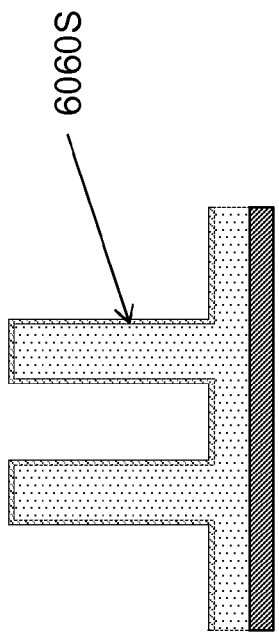

A thin metal layer 6060 is then isotropically deposited on the structure such that the metal layer is deposited on at least a portion of the sidewalls of pillar structures 6050a and 6050b (as illustrated in FIG. 6G). Examples of suitable metals that can be deposited include, but are not limited to, Pt, Ti, Pd, Ir, Ni, Co, W, Cr, Be, and the like, and/or any combination thereof. Thickness of the metal layer can range from about 2 nm to about 50 nm. Any suitable method known in the art for isotropic deposition of metal may be used here. Examples include, but are not limited to, CVD, electroless deposition, atomic layer deposition (ALD), thermal evaporation, sputtering, e-beam evaporation, and the like.

Figure 6H:
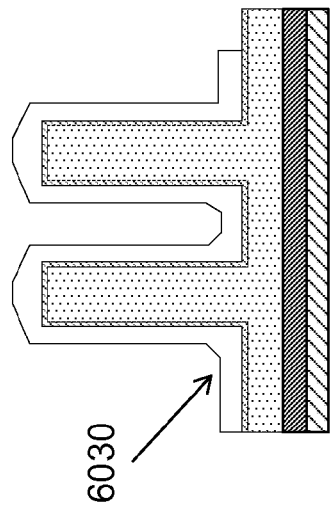

FIG. 6H illustrates a metal silicide layer 6060S on structures 6050a and 6050b. Following metal deposition the substrate is annealed at a suitable temperature for a suitable period of time to allow the metal layer to interact with the silicon to form a metal silicide layer. Depending on factors such as the deposited metal, the amount and type of dopants present in the substrate crystal, the environment (e.g., inert gas, or reactive gas), and so forth, some silicides can form at temperatures as low as 100° C. In other cases significantly higher temperatures, e.g. 1000° C., may be required to form the silicide. The substrate can be annealed for as time as short as 10 seconds or as long as several minutes depending on the thickness of the metal layer and the particular metal. In some cases, the annealing process may have to be performed in multiple steps to ensure that all of the metal has been silicized. The silicide may be amorphous or epitaxial depending on the various parameters of the process of silicide formation. Any method known in the art may be used for annealing. For example, in one process, laser annealing may be used for providing the thermal energy to a localized area such that other portions of the device are not heated. The metal silicide forms a vertical Schottky barrier junction with silicon of substrate.

Figure 6I:
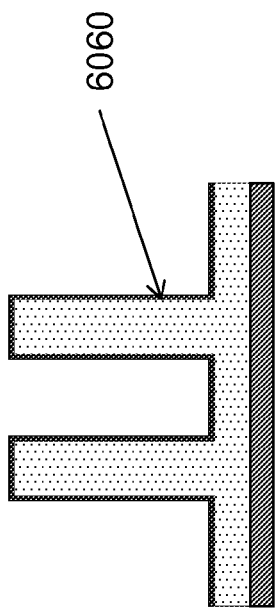

FIG. 6I illustrates a metal layer 6020 deposited on the back-surface of the substrate. Metal layer 6020 may include any suitable metal such as, for example, Al, Ni, Au, Ag, Cu, Ti, Pd, or combination thereof. Any suitable method known in the art may be used for depositing metal layer 6020 on the back surface. Examples of suitable methods include, but are not limited to, sputtering, pulsed laser deposition, CVD, thermal evaporation, electron-beam evaporation, and the like, or any combination thereof.

Figure 6J:
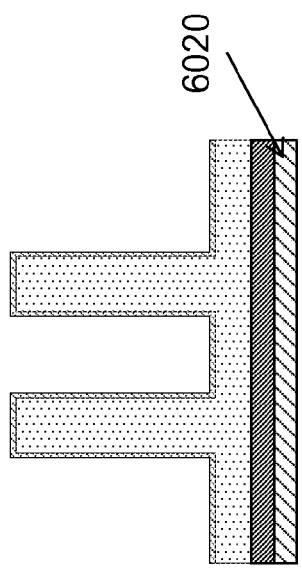

FIG. 6J illustrates an optical clad 6030 (e.g., $SiO_2$) deposited on the vertical Schottky barrier junction. While an optical clad layer of $SiO_2$ is illustrated herein, suitable materials for optical clad 6030 include, but are not limited to, transparent polymers such as polydimethyl siloxane (PDMS), polymethyl methacrylate (PMMA), polyethylene terephthalate (PET), and the like, and/or any combinations thereof; and doped or undoped metal oxides such as, $Al_2O_3$, $HfO_2$, $SiO_2$, $MgF_2$, SnO, doped SnO, ZnO, doped ZnO, and the like, and/or any combinations thereof. Any suitable method may be used for depositing optical clad 6030. For example, transparent polymers may be spin-coated and metal oxides may be deposited using CVD.

Example 2

A Pillar-Structured IR Detector Having a MiS Junction

Figure 7:
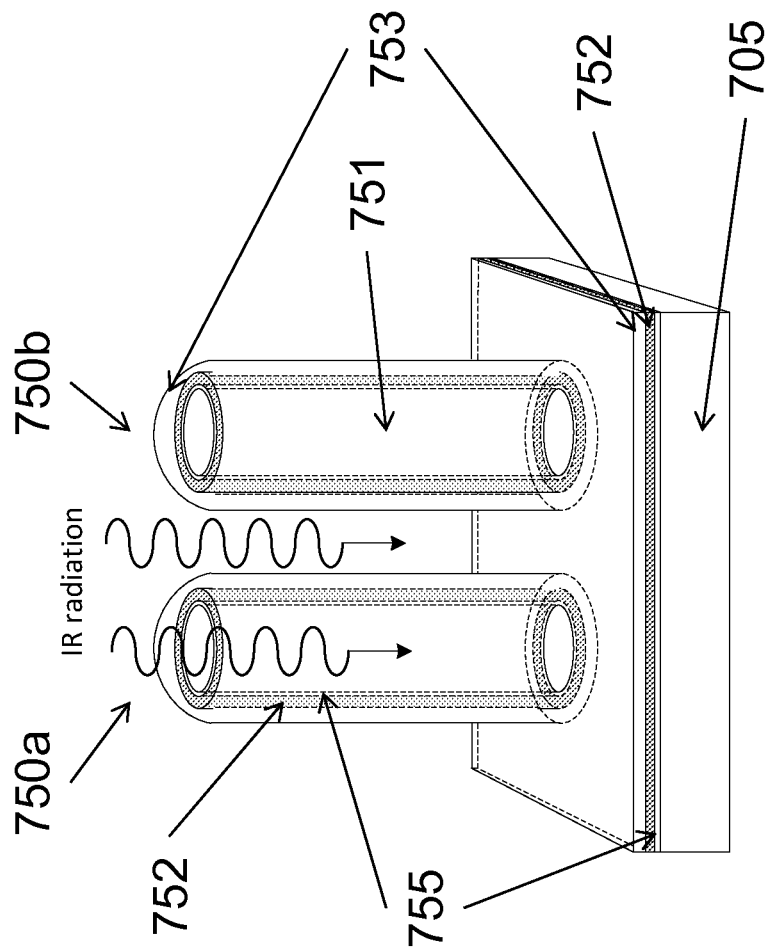
FIG. 7 illustrates an example of a pillar-structured IR detector, having an array of vertical MiS junctions, in accordance with various aspects of the present disclosure.

FIG. 7 illustrates a pillar-structured IR detector 700, having an array of vertical MiS junctions. The IR detector illustrated in FIG. 7 includes a silicon substrate 705 having a thickness of about 1 μm to about 50 μm, a metallic layer (not explicitly shown) for electrical connectivity having a thickness of about 50 nm to about 20 μm, a mounting substrate (not explicitly shown) having CMOS read-out circuitry (not explicitly shown) embedded therein, and vertical MiS junctions 750a and 750b. Vertical MiS junctions 750a and 750b each include a silicon core 751 having a diameter of about 0.1 μm to about 10 μm, an insulating layer 755 disposed on silicon core 751 and having a thickness of about 0.5 nm to about 10 nm, and a metal silicide layer 752 disposed on insulator layer 755 and having a thickness of about 2 nm to about 50 nm. IR detector 700 further includes a transparent (e.g., $SiO_2$) clad layer 753 having a thickness of about 50 nm to about 600 nm.

One of ordinary skill in the art will understand that the ranges for various dimensions and metals for the various metallic layers provided in this example are merely representative and not limiting. One of ordinary skill in the art will also understand that the dimensions may vary within that range for a same device or between different devices. For example, in a particular detector, the diameter of various core structures may vary within the range. Likewise, one of ordinary skill in the art will understand that the potential barrier between the metal (and/or metal silicide) and semiconductor determines the wavelength of light detected by the junction. Thus, metal used for a metallic layer may also be varied so as to sense a wide range of wavelengths. For example, a Pt-n-type Si junction has a Schottky barrier potential of about 0.85 eV and thus, detects light of a wavelength of up to about 1.5 μm (visible to near IR), whereas a Pt-p-type Si junction has a Schottky barrier potential of about 0.25 eV and thus, detects light of a wavelength of up to about 5 μm (which is well into far IR). In other words, one of ordinary skill in the art will recognize each pixel may have a different metallic layer so as to sense a wide range of IR wavelengths.

FIG. 8 illustrates the various fabrication steps used for making pillar-structured IR detector 700 illustrated in FIG. 7. Similar fabrication process can be used for making IR detector 700 as one used for making IR detector 500 and illustrated in FIG. 6. Particularly, the steps for obtaining silicon core 751 of IR detector 700 are identical to steps for obtaining silicon pillar structures 6050a and 6050b (as illustrated by FIGS. 6A-6F). These pillar structures form silicon core 751 for vertical MiS junctions 750a and 750b of IR detector 700.

Figure 8A:
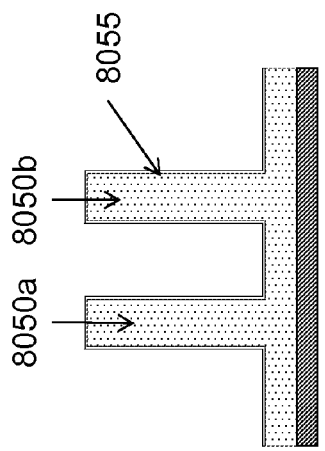
FIGS. 8A-8F schematically illustrate various steps during the fabrication of the pillar-structured IR detector illustrated in FIG. 7.

A thin insulating layer 8055 (as illustrated in FIG. 8A) of a suitable insulator such as, for example, silicon dioxide, is then isotropically deposited using a suitable method. Insulating layer 8055 is deposited such that at least a portion of the sidewalls of pillar structures 8050a and 8050b are covered by the insulator. Suitable insulator materials include, but are not limited to, $SiO_2$, $Si_3N_4$, $Al_2O_3$, $HfO_2$, and the like, and/or any combinations thereof. Suitable methods for depositing the insulator include, but are not limited to, atomic layer deposition (ALD), PECVD, thermal oxidation, and the like. Typical thickness of thin insulating layer 8055 can range from about 0.5 nm to about 10 nm.

Figure 8B:
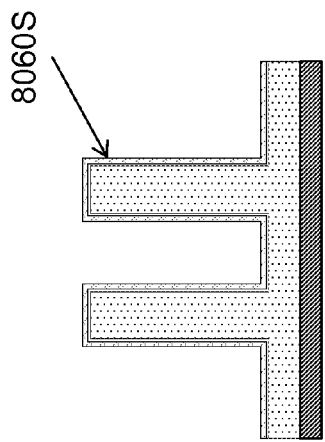

This is followed by isotropically depositing a nanocrystalline layer 8060S (as illustrated in FIG. 8B) of silicon using a suitable method such as PECVD or LPCVD. Nanocrystalline layer 8060S is deposited to substantially encapsulate thin insulating layer 7055 and may have a thickness in the range of about 1 nm to about 10 nm.

Figure 8C:
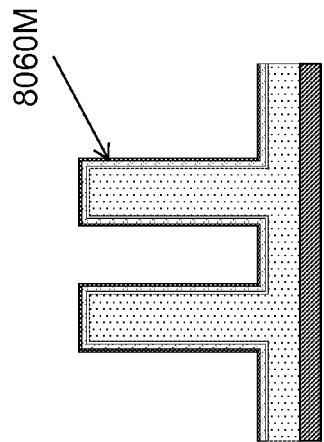

FIG. 8C illustrates a metal layer 8060M isotropically deposited on nanocrystalline layer 8060S so as to substantially encapsulate nanocrystalline layer 8060S. Examples of suitable metals that can be deposited include, but are not limited to, Pt, Ti, Pd, Ir, Ni, Co, Cu, W, Cr, Be, and the like, and/or any combination thereof. Thickness of the metal layer can range from about 2 nm to about 50 nm. Any suitable method known in the art for isotropic deposition of metal may be used here. Examples include, but are not limited to, CVD, electroless deposition, atomic layer deposition (ALD), thermal evaporation, sputtering, e-beam evaporation, and the like.

Figure 8D:
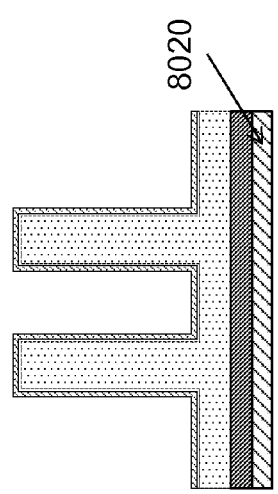
Figure 8E:
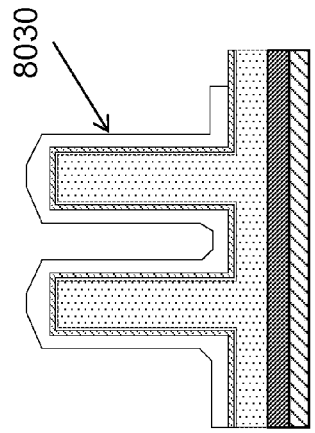

FIG. 8D illustrates a metal silicide layer 8060MS on structures 8050a and 8050b. Following metal deposition, the substrate is annealed at a suitable temperature for a suitable period of time to allow the metal layer to interact with nanocrystalline layer 8060S to form metal silicide layer 8060MS. Depending on factors such as the deposited metal, the amount and type of dopants present in the substrate crystal, the environment (e.g., inert gas, or reactive gas), and so forth, some silicides can form at temperatures as low as 100° C. In other cases significantly higher temperatures, e.g. 1000° C., may be required to form the silicide. The substrate can be annealed for as time as short as 10 seconds or as long as several minutes depending on the thickness of the metal layer and the particular metal. In some cases, the annealing process may have to be performed in multiple steps to ensure that all of the metal has been silicized. The silicide may be amorphous or epitaxial depending on the various parameters of the process of silicide formation. Any method known in the art may be used for annealing. For example, in one process, laser annealing may be used for providing the thermal energy to a localized area such that other portions of the device are not heated. The metal silicide together with thin insulating layer 8055 forms a vertical MiS junction with the semiconductor of the semiconductor core.

In an embodiment, the process for forming the vertical MiS junction described herein may be modified by depositing metal layer 8060M directly on thin insulating layer 8055 to form the vertical MiS junction. In such an embodiment, the step of depositing silicon can be omitted. Likewise, the annealing step can also be omitted.

This is followed by depositing of a metal layer 8020 (illustrated in FIG. 8E) deposited on the back-surface of the substrate. Metal layer 8020 may include any suitable metal such as, for example, Al, Ni, Au, Ag, Cu, Ti, Pd, or combination thereof. Any suitable method known in the art may be used for depositing metal layer 8020 on the back surface. Examples of suitable methods include, but are not limited to, sputtering, pulsed laser deposition, CVD, thermal evaporation, electron-beam evaporation, and the like, or any combination thereof. Metal layer 8020 acts as a backside contact for the IR detector.

Figure 8F:
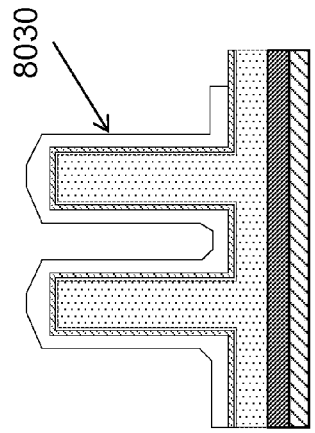

FIG. 8F illustrates an optical clad 8030 (e.g., $SiO_2$) deposited on the vertical Schottky barrier junction. While an optical clad layer of $SiO_2$ is illustrated herein, suitable materials for optical clad 8030 include, but are not limited to, transparent polymers such as polydimethyl siloxane (PDMS), polymethyl methacrylate (PMMA), polyethylene terephthalate (PET), and the like, and/or any combinations thereof; and doped or undoped metal oxides such as, $Al_2O_3$, $HfO_2$, $SiO_2$, $MgF_2$, SnO, doped SnO, ZnO, doped ZnO, and the like, and/or any combinations thereof. Any suitable method may be used for depositing optical clad 8030. For example, transparent polymers may be spin-coated and metal oxides may be deposited using CVD.

Example 3

A Pillar-Structured IR Detector Having a MiS Junction on an ROIC Chip

FIG. 9 illustrates the various fabrication steps used for making pillar-structured IR detector 700 illustrated in FIG. 7. Similar fabrication process can be used for making IR detector 700 as one used for making IR detector 500 and illustrated in FIG. 6. Particularly, the steps for obtaining silicon core 751 of IR detector 700 are identical to steps for obtaining silicon pillar structures 6050a and 6050b (as illustrated by FIGS. 6A-6F). These pillar structures form silicon core 751 for vertical MiS junctions 750a and 750b of IR detector 700.

In this example, an SOI wafer is used as a substrate (instead of the single crystal silicon substrate). The top semiconductor layer of the SOI wafer may be, for example, a heavily doped silicon layer having a thickness of about 0.5 μm. The buried insulator may be silicon dioxide having a thickness of about 1 μm, for example.

Figure 9A:
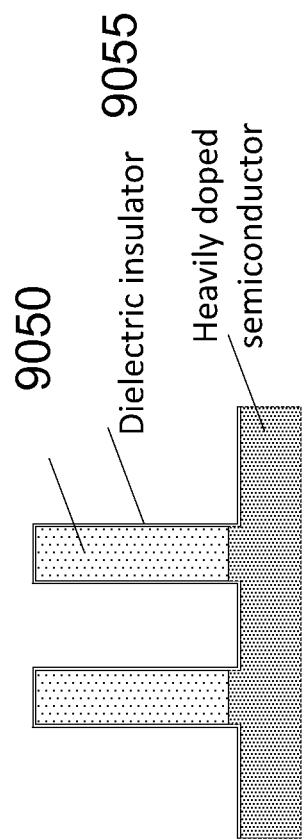

A thin insulating layer 9055 (as illustrated in FIG. 9A) of a suitable insulator such as, for example, silicon dioxide, is then isotropically deposited using a suitable method. Insulating layer 9055 is deposited such that at least a portion of the sidewalls of pillar structures 9050a and 9050b are covered by the insulator. Suitable insulator materials include, but are not limited to, $SiO_2$, $Si_3N_4$, $Al_2O_3$, $HfO_2$, and the like, and/or any combinations thereof. Suitable methods for depositing the insulator include, but are not limited to, atomic layer deposition (ALD), PECVD, thermal oxidation, and the like. Typical thickness of thin insulating layer 9055 can range from about 0.5 nm to about 10 nm.

A transparent polymer 9058 (as illustrated in FIG. 9B) is then disposed on the substrate so as to encapsulate pillar structures 9050a and 9050b. Any suitable transparent polymer such as, for example, PMMA or PDMS can be used for this process step. Transparent polymer 9058 is then cured at a suitable temperature (depending on the particular polymer used) so as to harden the polymer.

The encapsulated structure illustrated in FIG. 9B is then detached from the substrate by etching away the buried insulator using a suitable etchant (e.g., HF for silicon dioxide as the buried insulator) as illustrated in FIG. 9C. This is followed by partial removal of transparent polymer 9058 as illustrated in FIG. 9D such that at least a portion of each pillar structure is not encapsulated by the polymer. The polymer can be removed using any suitable step such as, for example, exposure to oxygen plasma, or a dry etch process.

A metal layer 9020M is deposited on pillar structures 9050a and 9050b as illustrated in FIG. 9E. Any suitable metal may be deposited in this step. Examples of suitable metals that can be deposited include, but are not limited to, Pt, Ti, Pd, Ir, Ni, Co, W, Cr, Be, and the like, and/or any combination thereof. Thickness of the metal layer can range from about 2 nm to about 50 nm. Any suitable method known in the art for isotropic deposition of metal may be used here. Examples include, but are not limited to, CVD, electroless deposition, atomic layer deposition (ALD), thermal evaporation, sputtering, e-beam evaporation, and the like.

Because the polymer material can be easily deformed on heating, a localized annealing (such as, for example, laser annealing) may be applied to metal layer 9020M such that a portion of metal layer 9020M in contact with pillar structures 9050a and 9050b is silicized to form a metal silicide layer 9020MS. The rest of the metal is layer is etched away using a suitable etchant depending on the particular metal used (as illustrated in FIG. 9F).

This is followed by aligning the pillar array on a pixel pad of an read-out integrated circuit (ROIC) chip 9090, as illustrated in FIG. 9G, and glued to the pixel pad using a suitable metallic glue 9110 such that the silicized portion 9020MS of the pillars is in contact with the metal contacts 9115 of the pixel pad. Suitable metallic glues may include, for example, silver paste or molten indium. The structure, in some cases, may be annealed to ensure a firm bond with ROIC chip 9090. Encapsulating transparent polymer 9058 may then be removed using any suitable method described herein.

FIG. 9H illustrates an insulating layer 9100 deposited between pillar structures 9050a and 9050b so as to insulate metal contacts 9115. This is followed by isotropically depositing a metal or a metal silicide layer 9060M or 9060MS (illustrated in FIG. 9I) as in Examples 1 and 2, to form the vertical MiS junctions.

An optical clad layer 9030 may then be deposited as in Examples 1 and 2 to form the IR detector.

Figure 10:
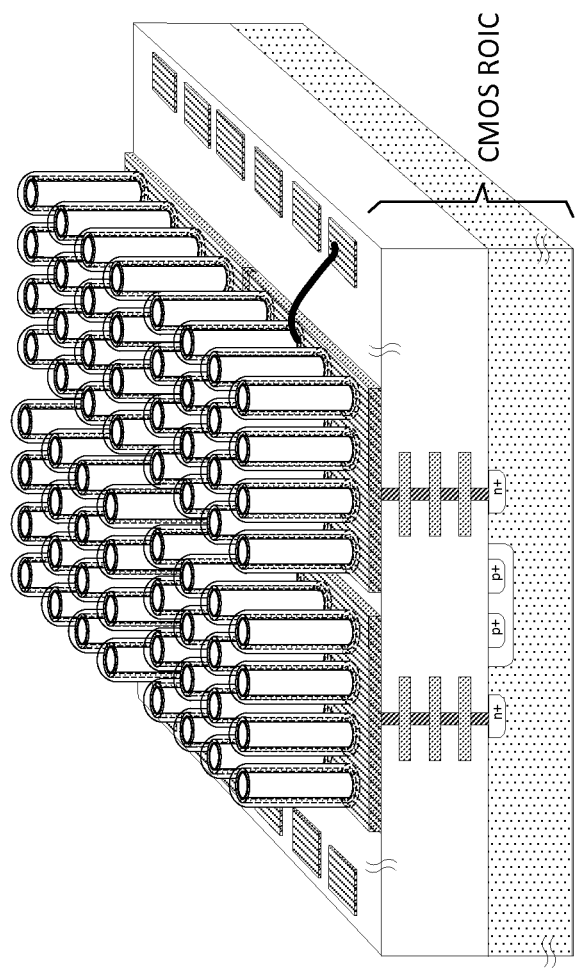
FIG. 10 illustrates an IR detector on an ROIC chip, fabricated using the process described with respect FIGS. 9B-9J.

FIG. 10 depicts an IR detector 1000 on an ROIC chip, fabricated using the process described with respect FIGS. 9H-9P. IR detector 1000 includes an array of vertical MiS junctions aligned with the pixels of the ROIC chip.

Example 4

A Pillar-Structured IR Detector Having a Monolithic MiS Junction on an ROIC Chip FIGS. 11A-11J schematically illustrate various steps during the fabrication of a pillar-structured IR detector 700 on the backside of an ROIC chip.

Figure 11A:
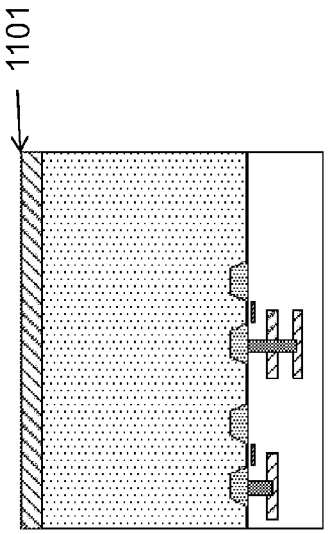
Figure 11B:
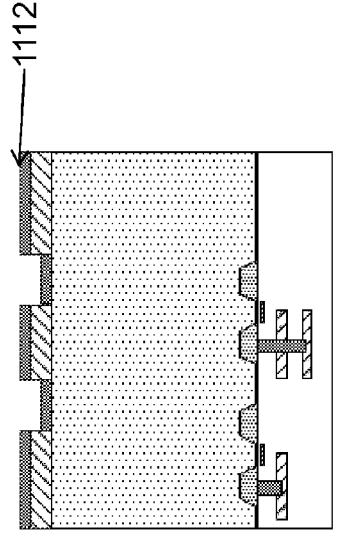

FIG. 11A illustrates an ROIC chip 1199 following a back-side thinning process. The back-side thinning can be achieved using any known process such as, for example, chemo-mechanical polishing. One of skill in the art will understand that while care must be taken that the front side of chip 1199 is well protected so as not to ruin the electronics inside, processes such as etching and ion milling may also be used under appropriate process parameters. This is equally applicable to any of the other processes used in the fabrication of pillar-structured IR detector detailed below. Likewise, one of ordinary skill in the art will understand that the bulk of the back-side of ROIC chip 1199 may be a p-type semiconductor, an n-type semiconductor or an intrinsic semiconductor.

Figure 11C:
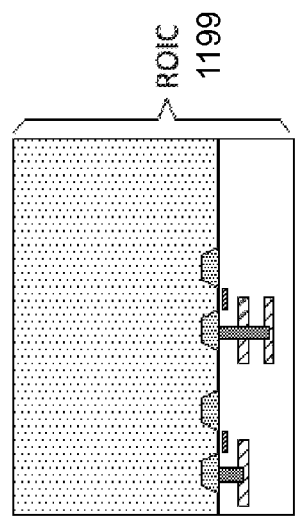
Figure 11D:
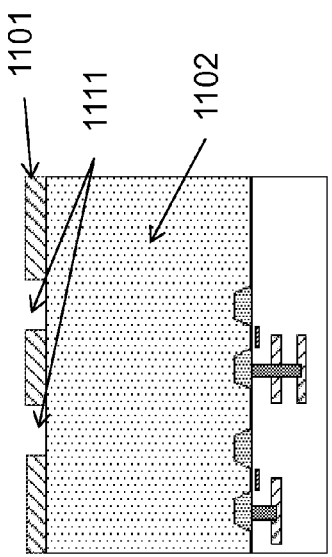

Photoresist (PR) 1101 (illustrated in FIG. 11B) is deposited by spin coating on the back-side top surface ROIC chip 1199 using any known process such as, for example, spin-coating, or spray-coating. FIG. 11C illustrates a pattern of openings (illustrated by 1111) through which the thinned back-side substrate 1102 of ROIC chip 1199 is exposed. The pattern of openings is obtained via a lithography step. The openings can be circular, elliptical, or any desired convex polygonal shape.

This is followed by deposition of an etch mask layer (illustrated by 1112 in FIG. 11D) over the remaining portion of the PR as well as on the exposed region of the substrate. Etch mask layer 1112 can be a metal such as Al, Cr, Au, and the like, and/or a dielectric such as $SiO_2$, $Si_3N_4$, and the like and can be deposited using any suitable process physical evaporation such as, thermal evaporation, electron-beam evaporation, sputtering, and the like, and/or chemical deposition such as chemical vapor deposition (CVD), plasma enhanced chemical vapor deposition (PECVD), and the like.

The remainder of PR is then lifted-off by a suitable solvent (e.g., acetone, or the like) and ashed in a resist asher to leave behind etch-mask layer 1112 directly on substrate 1102 (as illustrated in FIG. 11E) such that a portion of the substrate remains exposed. The exposed portion of the substrate is etched using a suitable dry or wet etch method to a desired depth to form pillar structures 1150a and 1150b (as illustrated in FIG. 11F). These pillar structures form semiconductor core 751 for vertical MiS junctions 750a and 750b of IR detector 700. Examples of a dry etch process include, but are not limited to, inductively coupled plasma reactive ion etch (ICP RIE) process, or Bosch process. Examples of wet etch process include, but are not limited to, metal assisted chemical etch (MACE) process. One of ordinary skill in the art will be able to choose a suitable etch process taking into account the need to protect the electronics in ROIC chip 1199 and also depending on factors such as the particular materials being used and the desired dimensions of various structures to be fabricated.

FIG. 11G illustrates pillar structures 1150a and 1150b after removal of the etch mask layer. Removal of the etch mask layer can be achieved using any suitable wet or dry etch process depending on the particular material of the etch mask layer.

A thin insulating layer 1155 (as illustrated in FIG. 8B) of a suitable insulator such as, for example, silicon dioxide, is then isotropically deposited using a suitable method. Insulating layer 1155 is deposited such that at least a portion of the sidewalls of pillar structures 1150a and 1150b are covered by the insulator. Suitable insulator materials include, but are not limited to, $SiO_2$, $Si_3N_4$, $Al_2O_3$, $HfO_2$, and the like, and/or any combinations thereof. Suitable methods for depositing the insulator include, but are not limited to, atomic layer deposition (ALD), PECVD, thermal oxidation, and the like. Typical thickness of thin insulating layer 1155 can range from about 0.5 nm to about 10 nm.

Figure 11I:
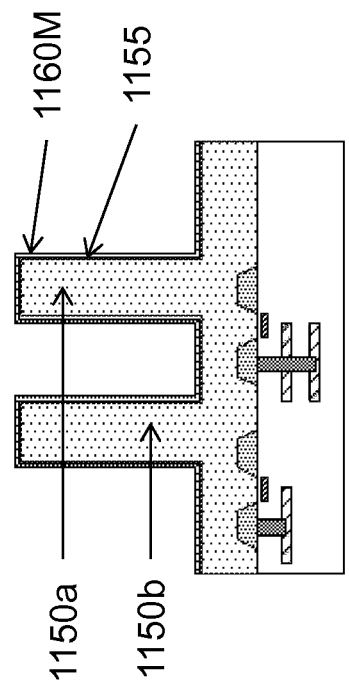

FIG. 11I illustrates a metal (or a metal silicide) layer 1160M isotropically deposited on thin insulating layer 1155.

Examples of suitable metals that can be deposited include, but are not limited to, Pt, Ti, Pd, Ir, Ni, Co, Cu, W, Cr, Be, and the like, and/or any combination thereof. Suitable metal silicides include, but are not limited to, PtSi, $Pt_2Si$, PdSi, $Pd_2Si$, NiSi, $Ni_2Si$, $CoSi_2$, IrSi, $IrSi_3$, $WSi_2$, CrSi, $CrSi_2$, TiSi, $TiSi_2$, BeSi, $Be_2Si$, or any combinations thereof. Thickness of metal (or a metal silicide) layer 1160M can range from about 2 nm to about 50 nm. Any suitable method known in the art for isotropic deposition of metal may be used here. Examples include, but are not limited to, CVD, electroless deposition, atomic layer deposition (ALD), thermal evaporation, sputtering, e-beam evaporation, and the like.

Figure 11J:
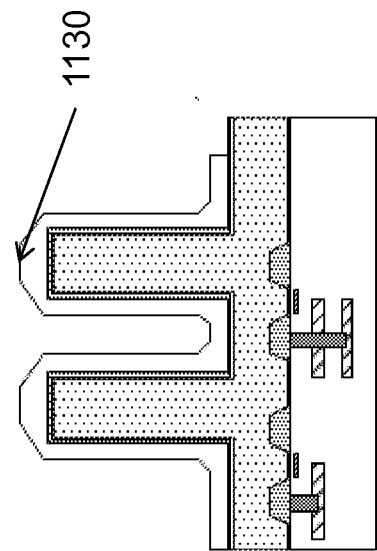

FIG. 11J illustrates an optical clad 1130 (e.g., $SiO_2$) deposited on the vertical MiS junctions. While an optical clad layer of $SiO_2$ is illustrated herein, suitable materials for optical clad 1130 include, but are not limited to, transparent polymers such as polydimethyl siloxane (PDMS), polymethyl methacrylate (PMMA), polyethylene terephthalate (PET), and the like, and/or any combinations thereof; and doped or undoped metal oxides such as, $Al_2O_3$, $HfO_2$, $SiO_2$, $MgF_2$, SnO, doped SnO, ZnO, doped ZnO, and the like, and/or any combinations thereof. Any suitable method may be used for depositing optical clad 1130. For example, transparent polymers may be spin-coated and metal oxides may be deposited using CVD.

Figure 12:
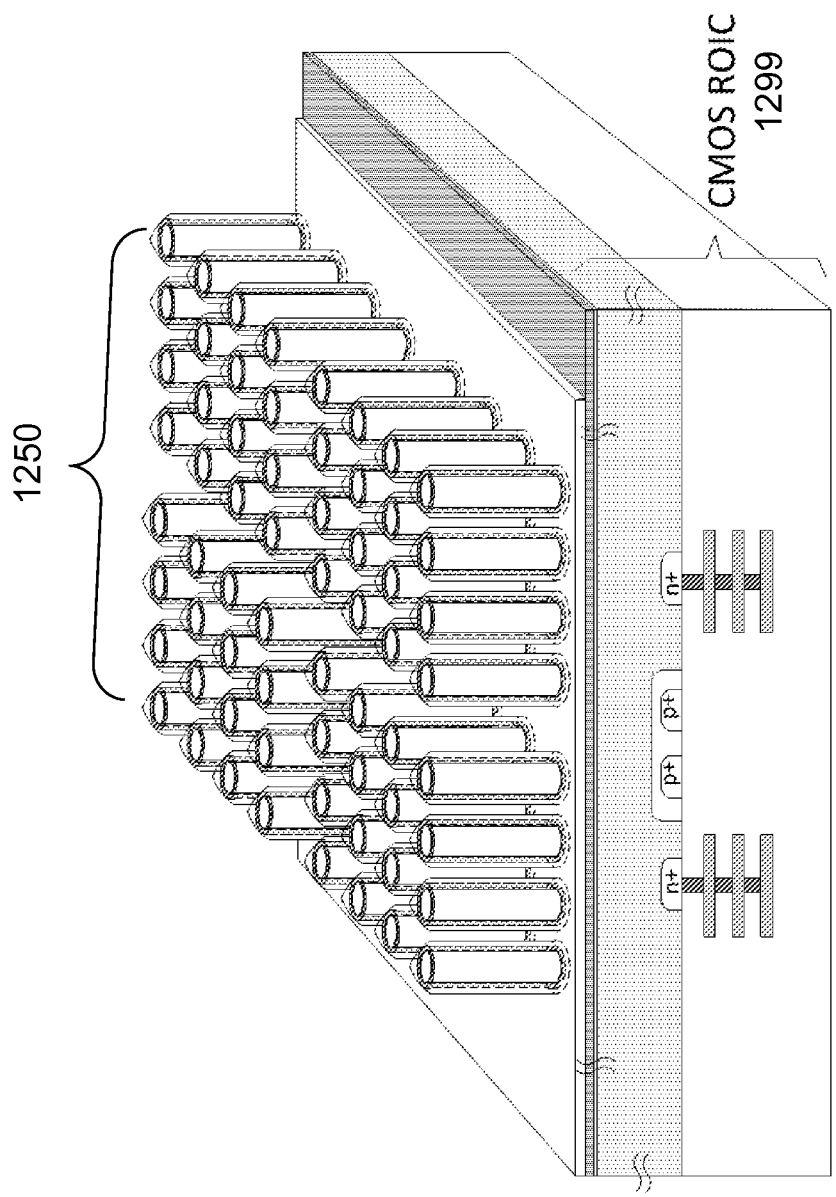
FIG. 12 illustrates a monolithic IR detector on an ROIC chip, fabricated using the process described with respect FIGS. 11A-11J.

FIG. 12 illustrates a monolithic IR detector 1200 on an ROIC chip, fabricated using the process described with respect FIGS. 11A-11J. IR detector 1200 includes an array 1250 of vertical MiS junctions aligned with the pixels of 1299 ROIC chip.

The foregoing detailed description has set forth various embodiments of the devices and/or processes by the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof.

The subject matter herein described sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A device comprising:
   a substrate; and
   one or more core structures, each having one or more shell layers disposed at least on a portion of a sidewall of the core structure, each of the one or more core structures extending substantially perpendicularly from the substrate,
   wherein each of the one or more core structures and at least one of the one or more shell layers disposed thereon form a metal-insulator-semiconductor (MiS) junction; and
   the device is configured to generate an electrical signal upon exposure to infrared radiation.

2. The device of claim 1, wherein at least one of the one or more shell layers comprise a material having substantially no band-gap.

3. The device of claim 1, wherein the substrate comprises a semiconductor material.

4. The device of claim 1, wherein the one or more core structures comprise essentially the same material composition as the substrate.

5. The device of claim 1, wherein the one or more core structures and the substrate have substantially no grain boundary therebetween.

6. The device of claim 1, wherein the substrate comprises one or more of a group IV single crystalline semiconductor, a group IV polycrystalline semiconductor, a single crystalline group III-V semiconductor, a single crystalline group II-VI semiconductor, and a single crystalline quaternary semiconductor.

7. The device of claim 1, wherein the at least one of the one or more shell layers comprises a metal or a metallic silicide.

8. The device of claim 7, wherein the metal comprises one or more of Pt, Pd, Ni, Co, It, W, Cr, Cu, Be, and Ti.

9. The device of claim 7, wherein the metallic silicide comprises one or more of PtSi, $Pt_2Si$, PdSi, $Pd_2Si$, NiSi, $Ni_2Si$, $CoSi_2$, IrSi, $IrSi_3$, $WSi_2$, CrSi, $CrSi_2$, TiSi, $TiSi_2$, and BeSi.

10. The device of claim 1, wherein the one or more shell layers comprise at least two layers, at least one being an insulator.

11. The device of claim 10, wherein the insulator comprises one or more of $Al_2O_3$, $Si_3N_4$, $HfO_2$ and $SiO_2$.

12. The device of claim 1, further comprising a clad disposed on each of the one or more core structures such that the clad substantially encapsulates the one or more core structures.

13. The device of claim 12, wherein the clad comprises a transparent material comprising one or more of $Al_2O_3$, $HfO_2$, $SiO_2$, $MgF_2$, In-doped SnO, Al-doped ZnO, and a transparent polymer.

14. The device of claim 1, wherein at least a portion of the one or more core structures at an end opposite the substrate is rounded or tapered.

15. The device of claim 1, wherein an aspect ratio of each of the one or more core structures is greater than one.

16. The device of claim 1, wherein the one or more core structures have a cross-section including one or more of a circle, an ellipse, a convex polygon, and a mesh.

17. The device of claim 1, further comprising an electronic circuit, in electrical communication with the device, configured to process the electrical signal.

18. The device of claim 1, further comprising an optical filter configured to filter out visible light from radiation incident on the device.

19. A method of making the device of claim 1, the method comprising:
  making the one or more core structures;
  disposing a metallic material to substantially encapsulate an extending portion of each of the one or more core structures; and
  providing thermal energy to the one or more core structures such that the metallic material interacts with a material of the one or more core structures to form an alloy or a compound layer on each of the one or more core structures.

20. The method of claim 19, further comprising:
  disposing an insulating material on each of the one or more core structures to substantially encapsulate the extending portion of each of the one or more core structures; and
  disposing, following the disposing of the insulating material, a semiconductor material on each of the one or more core structures to substantially encapsulate the extending portion of each of the one or more core structures,
  wherein disposing the insulating material and disposing the semiconductor is performed prior to disposing the metallic material.

21. The method of claim 19, further comprising:
  disposing an insulating material on each of the one or more core structures to substantially encapsulate the extending portion of each of the one or more core structures;
  disposing, following the disposing of the insulating material, a transparent polymer material such that each of the one or more core structures is substantially encapsulated and a space between the one or more core structures is substantially filled;
  separating the one or more core structures along with the transparent polymer material from the substrate;
  removing at least a portion of the transparent polymer material such that at least a portion of the one or more core structures is not encapsulated by the transparent polymer material; and
  disposing a metallic material such that at least a portion of each of the one or more core structures not encapsulated by the transparent polymer material is encapsulated by the metallic material.

22. The method of claim 21, further comprising:
  aligning the one or more structures on a pixel array such that each of the one or more structures aligns with at least one pixel; and
  joining the one or more structures with the pixel array.

23. The method of claim 19, wherein providing thermal energy comprises laser annealing the device to locally increase a temperature of the one or more core structures.

24. A photodetector device comprising:
  a substrate; and
  one or more structures, each extending substantially perpendicularly from the substrate, and each having a core-shell junction along at least a portion of a sidewall of the structure,
  wherein the core-shell junction is configured to generate an electrical signal upon exposure to incident electromagnetic radiation;
    Wherein the core-shell junction comprises a metal-insulator-semiconductor (MIS) junction; and
    the device is configured to generate an electrical signal upon exposure to infrared radiation.

25. The device of claim 24, wherein the core-shell junction comprises a potential-barrier for charge carriers crossing the core-shell junction.

26. The device of claim 24, wherein the substrate and the one or more structures have substantially no grain boundary therebetween.

27. The device of claim 24, wherein an aspect ratio of each of the one or more structures is greater than one.

28. The device of claim 24, wherein each of the one or more structures having one or more shell layers disposed at least on a portion of a sidewall of the structure, at least one of the one or more shell layers comprising a material having substantially no band-gap.

29. The device of claim 24, further comprising an electronic circuit, in electrical communication with the device, configured to process the electrical signal.

30. An imaging device comprising:
  a substrate;
  an array of core structures, each of the core structures having one or more shell layers disposed at least on a portion of a sidewall of each of the core structures, each of the core structures extending substantially perpendicularly from the substrate,
  wherein each of the core structures and the one or more shell layers form a core-shell junction configured to generate an electrical signal upon exposure to incident electromagnetic radiation;
  a pixel array, wherein each of the pixels comprises the array of core structures;
  and an electronic circuit, in electrical communication with the pixel array, configured to process the electrical signal;
    Wherein the core-shell junction comprises a metal-insulator-semiconductor (MIS) junction; and
    the device is configured to generate an electrical signal upon exposure to infrared radiation.

31. The imaging device of claim 30, wherein the core-shell junction comprises a potential-barrier for charge carriers crossing the core-shell junction.

32. The imaging device of claim 30, wherein the substrate and the one or more core structures have substantially no grain boundary therebetween.

33. The imaging device of claim 30, wherein an aspect ratio of each of the one or more core structures is greater than one.

34. The imaging device of claim 20, wherein at least one of the one or more shell layers comprises a material having substantially no band-gap.

35. A method of detecting electromagnetic radiation, the method comprising:
  obtaining a device comprising a substrate, and one or more structures, each extending substantially perpendicularly from the substrate, and each having a core-shell junction along at least a portion of a sidewall of the structure, wherein the core-shell junction is configured to generate an electrical signal upon exposure to incident electromagnetic radiation;
  exposing the device to electromagnetic radiation; and
  processing the electrical signal;
    Wherein the core-shell junction comprises a metal-insulator-semiconductor (MIS) junction; and
    the device is configured to generate an electrical signal upon exposure to infrared radiation.

36. The method of claim 35, wherein the device further comprises an electronic circuit, in communication with the device, configured for processing the electrical signal.

37. The method of claim 35, wherein the substrate comprises a semiconductor material.

38. The method of claim 35, wherein the device further comprises a clad disposed on each of the one or more structures such that the clad substantially encapsulates the structure.

* * * * *